United States Patent
Avramescu et al.

(10) Patent No.: US 9,478,945 B2
(45) Date of Patent: Oct. 25, 2016

(54) OPTOELECTRONIC SEMICONDUCTOR BODY AND METHOD FOR PRODUCING AN OPTOELECTRONIC SEMICONDUCTOR BODY

(75) Inventors: Adrian Stefan Avramescu, Regensburg (DE); Ines Pietzonka, Donaustauf (DE); Dimitri Dini, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 48 days.

(21) Appl. No.: 14/126,047

(22) PCT Filed: May 15, 2012

(86) PCT No.: PCT/EP2012/058969
§ 371 (c)(1),
(2), (4) Date: Feb. 4, 2014

(87) PCT Pub. No.: WO2012/171736
PCT Pub. Date: Dec. 20, 2012

(65) Prior Publication Data
US 2014/0138703 A1    May 22, 2014

(30) Foreign Application Priority Data
Jun. 15, 2011 (DE) .......... 10 2011 077 542

(51) Int. Cl.
*H01L 29/49* (2006.01)
*H01S 5/22* (2006.01)
*H01L 21/02* (2006.01)
(Continued)

(52) U.S. Cl.
CPC ............ *H01S 5/22* (2013.01); *H01L 21/0242* (2013.01); *H01L 21/0254* (2013.01); *H01L 21/02381* (2013.01); *H01L 21/02389* (2013.01); *H01L 21/02458* (2013.01); *H01L 21/02507* (2013.01); *H01L 21/02576* (2013.01);
(Continued)

(58) Field of Classification Search
CPC ............ H01L 29/2003; H01L 25/205; H01L 21/02609; H01L 21/02576; H01L 21/02507; H01L 21/0242; H01L 21/02381; H01L 21/02647; H01L 21/02389; H01L 21/02458
See application file for complete search history.

(56) References Cited

U.S. PATENT DOCUMENTS 6,377,596 B1  4/2002 Tanaka et al.
6,597,017 B1  7/2003 Seko et al.
(Continued)

FOREIGN PATENT DOCUMENTS

CN   1347581 A   5/2002
CN   1413357 A   4/2003
(Continued)

OTHER PUBLICATIONS

Czernecki, R., et al., "Strain-compensated AlGaN/GaN/InGaN cladding layers in homoepitaxial nitride devices," Applied Physics Letters, vol. 91, No. 23, Dec. 2007, pp. 231914-1-231914-3.

*Primary Examiner* — Michael Shingleton
(74) *Attorney, Agent, or Firm* — Slater & Matsil, L.L.P.

(57) ABSTRACT

An optoelectronic semiconductor body has a substrate that includes a strained layer that is applied to the substrate in a first epitaxy step. The strained layer includes at least one recess formed vertically in the strained layer. In a second epitaxy step, a further layer applied to the strained layer. The further layer fills the at least one recess and covers the strained layer at least in some areas.

19 Claims, 26 Drawing Sheets

(51) Int. Cl.
*H01L 29/20* (2006.01)
*H01L 29/205* (2006.01)

(52) U.S. Cl.
CPC .. *H01L 21/02609* (2013.01); *H01L 21/02647* (2013.01); *H01L 29/2003* (2013.01); *H01L 29/205* (2013.01)

(56) References Cited

U.S. PATENT DOCUMENTS

| | | |
|---|---|---|
| 6,606,335 B1 | 8/2003 | Kuramata et al. |
| 6,797,416 B2 | 9/2004 | Wada et al. |
| 6,835,956 B1 | 12/2004 | Nagahama et al. |
| 8,023,544 B2 | 9/2011 | Bour et al. |
| 2003/0092263 A1 | 5/2003 | Koike et al. |
| 2007/0072324 A1 | 3/2007 | Krames et al. |
| 2007/0231488 A1 | 10/2007 | Von Kaenel |
| 2008/0224151 A1 | 9/2008 | Hata et al. |
| 2010/0074292 A1 | 3/2010 | Bour et al. |

FOREIGN PATENT DOCUMENTS

| | | |
|---|---|---|
| CN | 101273472 A | 9/2008 |
| DE | 102008010511 A1 | 8/2009 |
| EP | 1052684 A1 | 11/2000 |
| JP | 2000244061 A | 9/2000 |
| JP | 2000323417 A | 11/2000 |
| JP | 2000349393 A | 12/2000 |
| JP | 2002540618 A | 11/2002 |
| JP | 201080960 A | 4/2010 |
| WO | 0058999 A2 | 10/2000 |
| WO | 2005108654 A1 | 11/2005 |
| WO | 2010094371 A2 | 8/2010 |

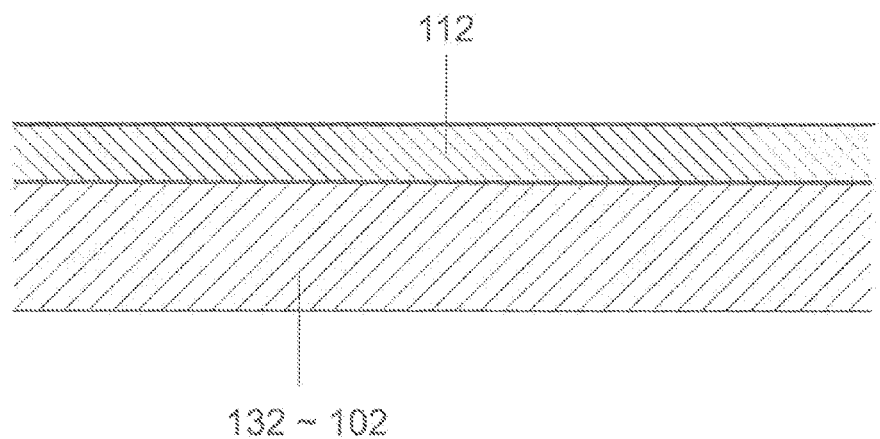
FIG 3a.1
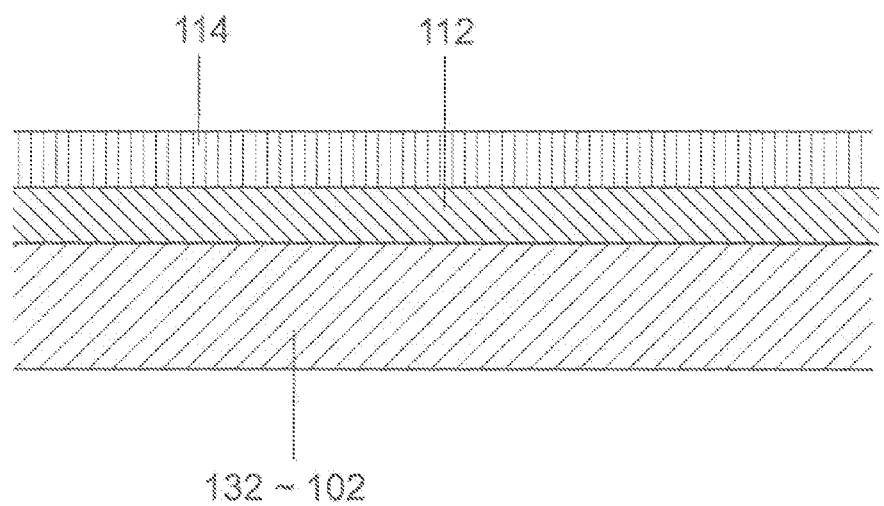
FIG 3a.2
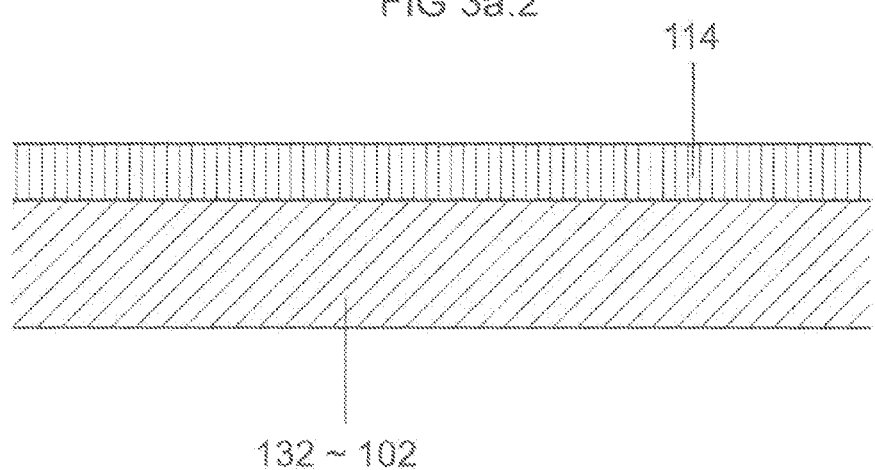
FIG 3a.3

OPTOELECTRONIC SEMICONDUCTOR BODY AND METHOD FOR PRODUCING AN OPTOELECTRONIC SEMICONDUCTOR BODY

This patent application is a national phase filing under section 371 of PCT/EP2012/058969, filed May 15, 2012, which claims the priority of German patent application 10 2011 077 542.0, filed Jun. 15, 2011, each of which is incorporated herein by reference in its entirety.

TECHNICAL FIELD

The present invention relates to an optoelectronic semiconductor body and a method for producing an optoelectronic semiconductor body.

BACKGROUND

Optoelectronic semiconductor bodies typically have an epitaxial layer sequence comprising an active layer suitable for generating electromagnetic radiation. The entirety of the epitaxially grown semiconductor layers is designated as an epitaxial layer sequence. Such an epitaxial layer sequence can be deposited by means of epitaxy on a substrate. Mechanical tensions can occur between the epitaxial layer sequence and the substrate. Such tensions can result in deflection of the semiconductor body and/or cracks in the epitaxial layer sequence. This can occur during the epitaxial deposition of non-lattice adapted connecting semiconductors. For example, connecting semiconductors such as aluminum gallium nitride (AlGaN) or indium gallium nitride (InGaN) can be deposited on a substrate made of gallium nitride (GaN).

SUMMARY OF THE INVENTION

Embodiments of the invention specify an optoelectronic semiconductor body, in which the tension between substrate and epitaxial layer sequence and/or the cracking in the epitaxial layer sequence is reduced.

Various embodiments of an optoelectronic semiconductor body have a tensioned layer, which was applied in a first epitaxy step to a substrate. The tensioned layer has at least one recess formed vertically in the tensioned layer. In a second epitaxy step, a further layer was applied to the tensioned layer, which fills up the at least one recess and at least regionally covers the tensioned layer. This arrangement ensures that the tension between substrate and epitaxial layer sequence and/or the cracking in the epitaxial layer sequence is reduced.

The tension occurs because the "natural" lattice constants of the substrate and of the tensioned layer are different from one another. "Natural" means in the present document that the value of the lattice constant was respectively determined on an isolated system. In other words, the values of the lattice constants apply for layers in the non-tensioned state, i.e., for layers which are not in contact with one another. The term "lattice constant" always means "natural lattice constant" hereafter. In addition, the term lattice constant in the present case designates the value of the lattice constant parallel to the growth surface of the epitaxial layers. The greater the deviation of the lattice constants from layers which are epitaxially grown directly on one another, the stronger the tension between these layers in general.

In addition, substrate and tensioned layer may have coefficients of thermal expansion which differ from one another. This can also contribute to the tension between the tensioned layer and the substrate.

In one preferred embodiment, the deviation of the lattice constant of the further layer ($a_w$) from the lattice constant of the substrate ($a_s$) is less than the deviation of the lattice constant of the tensioned layer ($a_v$) from the lattice constant of the substrate ($a_s$). The above conditions for the lattice constants can be represented as follows:

$$a_w < a_s \text{ and } a_v < a_s \text{ and } a_v < a_w.$$

The tensioned layer and the further layer are tensilely tensioned with the substrate according to the above conditions. The crystal structure of the further layer is better adapted to the crystal structure of the substrate than the crystal structure of the tensioned layer. This is particularly advantageous, since the tension of the system made of substrate, tensioned layer having recess(es), and further layer, which fills up the recess(es), is thus less than the known tension of the system made of substrate and tensioned layer without recesses.

If the tensioned layer is the shell layer of an edge-emitting semiconductor laser and the further layer is the waveguide layer of this edge-emitting semiconductor laser, the index of refraction of the tensioned layer must be as small as possible because of the desired total reflection. This is achieved by the highest possible aluminum content. The higher the aluminum content, the less the lattice constant of the tensioned layer ($a_v$) and the stronger the tension between the tensioned layer and the substrate.

In one alternative preferred embodiment, the tensioned layer is tensilely tensioned and the further layer is compressively tensioned. In other words, opposing tensions are combined. This is achieved by the following relationship between the lattice constants:

$$a_w > a_s \text{ and } a_v < a_s.$$

The lattice constant of the further layer ($a_w$) is greater than the lattice constant of the substrate ($a_s$) and at the same time the lattice constant of the tensioned layer ($a_v$) is less than the lattice constant of the substrate ($a_s$). This is particularly advantageous since thus the tension of the system made of substrate, tensioned layer having recess(es), and further layer can be reduced.

In one alternative preferred embodiment, the tensioned layer is compressively tensioned and the further layer is tensilely tensioned. In other words, opposing tensions are combined. This is achieved by the following relationship between the lattice constants:

$$a_w < a_s \text{ and } a_v > a_s.$$

The lattice constant of the further layer ($a_w$) is less than the lattice constant of the substrate ($a_s$) and at the same time the lattice constant of the tensioned layer ($a_v$) is greater than the lattice constant of the substrate ($a_s$). This is particularly advantageous, since thus the tension of the system made of substrate, tensioned layer having recess(es), and further layer can be reduced.

In the special case of a so-called pseudomorphic growth of the tensioned layer on the substrate, the lattice constants of tensioned layer and substrate parallel to the interface of substrate and tensioned layer are approximately identical. The lattice constants of tensioned layer and substrate perpendicular to the interface of substrate and tensioned layer are different, however.

In one preferred embodiment, the tensioned layer is thinned in the recess. In other words, the tensioned layer is structured. This is advantageous since thus the tension between the substrate and the tensioned layer is reduced. The tensioned layer can relax at the recess. The recess extends perpendicularly to the substrate.

In one preferred embodiment, the tensioned layer can be entirely interrupted at the recess. This reduces the tension in the tensioned layer still further than if the tensioned layer is only thinned in the recess.

In one preferred embodiment, the recess can traverse both the entire tensioned layer and also a part of the substrate perpendicularly to the substrate.

In one preferred embodiment, the further layer can completely cover the tensioned layer. This is advantageous since thus a planar surface is formed, on which further epitaxial layers can be grown.

In one preferred embodiment, the thickness of the tensioned layer can be between 0.5 μm and 5 μm, preferably between 1 μm and 3 μm. This large thickness in comparison to known arrangements is advantageous since thus the optical properties of the epitaxial layer sequence are decoupled from the substrate. For example, if the shell layer of an edge-emitting semiconductor laser is assumed as the tensioned layer, interfering substrate modes can be suppressed and the emission characteristic can be improved by the great thickness. The interfering substrate modes can occur in transparent substrates. The substrate is not absorbent for the electromagnetic radiation generated in the active zone. For example, a substrate comprising GaN can be transparent for electromagnetic radiation in the blue spectral range. A part of the blue light guided in the waveguide and shell layer can penetrate into the substrate comprising GaN. This light component is lost for the laser emission. Above all, however, the emission characteristic is interfered with.

In one preferred embodiment, the optoelectronic semiconductor body can have at least one recess of a first type and/or at least one recess of a second type.

In one preferred embodiment, the at least one recess of a first type can have a width of 5 μm to 100 μm. This recess is used exclusively to reduce the mechanical tension in the tensioned layer. The width of 5 μm or more is advantageous since thus the tensioned layer is given enough space at the recess in order to relax without forming cracks. The optoelectronic semiconductor body can have a plurality of recesses of a first type. In particular, the optoelectronic semiconductor body can exclusively have recesses of a first type.

In one preferred embodiment, the at least one recess of a second type can have a width of 0.1 μm to 5 μm. This is particularly advantageous since a current injection into layers which are arranged after the tensioned layer can be performed through the recess of the second type. By limiting the width to at most 5 μm, it is ensured that an electromagnetic wave which propagates in a component is not interfered with by the recess of the second type. In addition, the tension in the tensioned layer is also reduced by the recess of the second type. The optoelectronic semiconductor body can have a plurality of recesses of a second type. In particular, the optoelectronic semiconductor body can exclusively have recesses of a second type.

In one preferred embodiment, the substrate can comprise GaN. The tensioned layer can be a shell layer made of $In_xAl_yGa_{1-x-y}N$ ($0 \leq x \leq 0.1$ and $0 \leq y \leq 1$). The indium content x can be between 0% and 10% atomic percentage. When an AlGaN shell layer is referred to hereafter for the sake of simplicity, this also comprises the case of a non-negligible indium content. The aluminum content can vary between 0.1% and 100%, preferably between 4% and 30% atomic percentage. The higher the aluminum content of the shell layer, the less the index of refraction of the shell layer. The less the index of refraction of the shell layer, the more light can be totally reflected at the interface of shell layer to a waveguide arranged thereon having a higher index of refraction. However, the electrical conductivity decreases with increasing aluminum content. If the following epitaxial layers are to be energized via the AlGaN shell layer, the upper limit of the aluminum content in the AlGaN shell layer is approximately 30% atomic percentage. The AlGaN shell layer can have an n-conductivity. The AlGaN shell layer is doped for this purpose using silicon, oxygen, or germanium.

The tension in the AlGaN shell layer and the deflection of the substrate increase with increasing thickness of the AlGaN shell layer and with increasing aluminum content in the AlGaN shell layer.

Alternatively, the substrate can comprise silicon or sapphire, the lattice constant of which deviates strongly from the lattice constant of GaN. In order to epitaxially grow an AlGaN shell layer thereon, firstly a thin GaN layer can be applied to the substrate as a seed layer. This is designated as a quasi-substrate or engineered substrate.

In one preferred embodiment, an intermediate layer, in particular made of $In_xGa_{1-x}N$ ($0 \leq x \leq 0.5$), can be applied between the AlGaN shell layer and the substrate comprising GaN. The intermediate layer can be compressively tensioned. The connection of tensilely tensioned AlGaN shell layer and compressively tensioned InGaN intermediate layer reduces the deflection of the substrate and the danger of cracking in the AlGaN shell layer. The intermediate layer can be electrically conductive. The intermediate layer can be compressively tensioned and electrically conductive at the same time.

The arrangement of an electrically conductive intermediate layer is particularly advantageous if the substrate is a poor electrical conductor or even a non-conductor, such as sapphire.

In one preferred embodiment, the further layer is a waveguide having a first conductivity, in particular an n-conductivity. In the growth direction, it is followed by an active zone, a waveguide layer having a second conductivity, in particular having a p-conductivity, and a shell layer having a second conductivity, in particular having a p-conductivity. The above epitaxial layers can form an edge-emitting laser diode.

The active zone can be a pn-junction, a double heterostructure, a multiple quantum well structure (MQW), or a single quantum well structure (SQW). Quantum well structure means: quantum wells (three-dimensional), quantum wires (two-dimensional), and quantum points (one-dimensional).

In one preferred embodiment, the substrate can comprise GaN and the tensioned layer can be a Bragg mirror made of alternating layers of InGaN and AlGaN, with the composition $In_xGa_{1-x}N$ ($0 \leq x \leq 0.2$) and $Al_yGa_{1-y}N$ ($0 \leq y \leq 1$). The Bragg mirror can be n-conductive. An active zone can follow the n-conductive Bragg mirror and a p-conductive Bragg mirror can follow the active zone. The entirety of the layers results in a vertically emitting laser (VCSEL).

In one preferred embodiment, the further layer grown in the second epitaxial step can have a first conductivity, in particular an n-conductivity. For example, in the case of an edge-emitting semiconductor laser, the further layer can have the function of an n-conductive waveguide. The waveguide layer is defined in that the index of refraction thereof is greater than the index of refraction of the shell layer. The composition of the n-waveguide can have $In_xAl_yGa_{1-x-y}N$ ($0 \leq x \leq 0.1$ and $0 \leq y \leq 0.3$). The n-waveguide made of InAlGaN can have a uniform indium content (x) and a uniform aluminum content (y) over its extension perpendicular to the growth surface. Alternatively, a variation of the indium content (x) and of the aluminum content (y) can occur over the extension perpendicular to the growth surface.

In one preferred embodiment, an optoelectronic component can be isolated from the above-described optoelectronic semiconductor bodies.

In one preferred embodiment, the tensioned AlGaN shell layer can be laterally overgrown by a conductive, in particular n-conductive, layer. This is advantageous in order to supply the further layer following the tensioned layer with current. In the case of components based on GaN, this is particularly relevant in the case of a very thick tensioned layer, in particular thicker than 1 µm, and/or in the case of a tensioned layer having a high aluminum content, in particular greater than 30% atomic percentage. A tensioned layer thus formed has a very low electrical conductivity. The lateral overgrowth of the tensioned layer with an n-conductive layer is then absolutely necessary.

Various embodiments comprise a method for producing an optoelectronic semiconductor body. Firstly, a substrate is provided. A tensioned layer is epitaxially grown on the substrate. The tensioned layer is structured in order to produce at least one vertical recess in the tensioned layer. Following the structuring, a further layer is epitaxially grown. This further layer fills up the at least one recess and at least regionally covers the tensioned layer.

Optoelectronic components can be isolated from the optoelectronic semiconductor body, for example, by laser sawing.

In one preferred embodiment, before the growth of the tensioned layer made of $In_xAl_yGa_{1-x-y}N$ ($0 \leq x \leq 0.1$ and $0 \leq y \leq 1$) on a substrate comprising GaN, an intermediate layer, in particular made of $In_xGa_{1-x}N$ ($0 \leq x \leq 0.5$), is epitaxially applied. The InGaN intermediate layer can be compressively tensioned and/or electrically conductive. The compressive tension is advantageous, since thus the tensile tension in the tensioned AlGaN shell layer is at least partially compensated for.

BRIEF DESCRIPTION OF THE DRAWINGS

Various exemplary embodiments of the solution according to the invention are explained in greater detail hereafter on the basis of the drawings. Identical, similar, or identically acting elements are provided with the same reference signs in the figures. The figures and the size ratios of the elements shown in the figures to one another are not to be considered to be to scale. Rather, individual elements can be shown exaggeratedly large or small for better representation ability and for better understanding.

FIG. 1b shows a top view of the known optoelectronic semiconductor body from FIG. 1a;

FIG. 14b shows a sectional view of the semiconductor body from FIG. 14a;

DETAILED DESCRIPTION OF ILLUSTRATIVE EMBODIMENTS

Figure 1A:
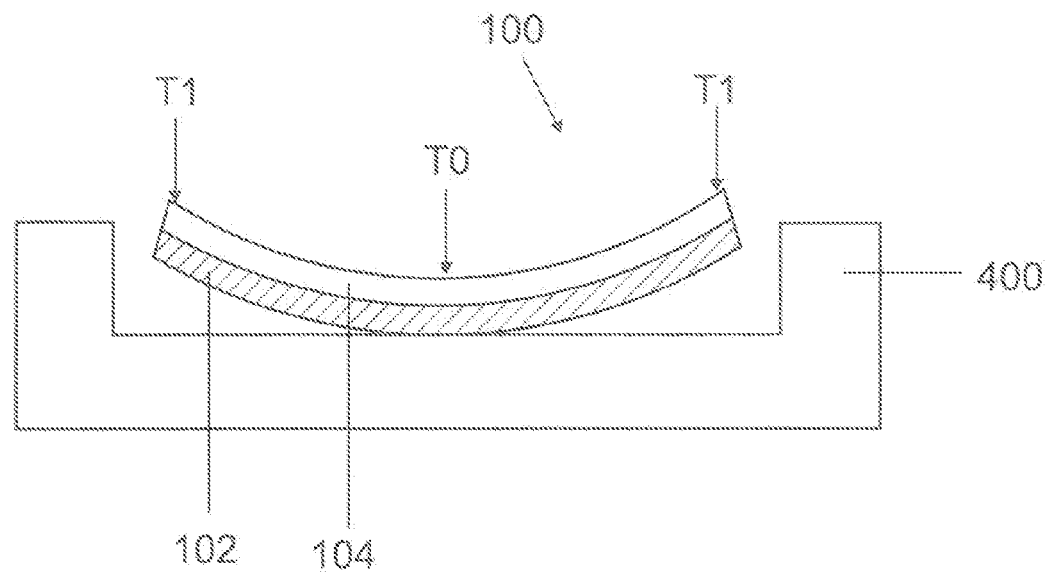
FIG. 1a shows a sectional view of a known optoelectronic semiconductor body having a deflection.

FIG. 1a shows a sectional view of a known optoelectronic semiconductor body 100 having a deflection. A tensioned layer 104 is grown on the substrate 102. The tension between the substrate 102 and the tensioned layer 104 is the cause of the deflection. The semiconductor body 100 is arranged on a carrier 400 in epitaxy equipment (not shown). Because of the deflection of the semiconductor body 100, the semiconductor body 100 does not rest completely on the carrier 400. An inhomogeneous temperature profile thus results over the extension of the semiconductor body 100 in parallel to the carrier 400. The semiconductor body 100 has a temperature T0 in the center which is higher than a temperature T1 at the edge.

Figure 1B:
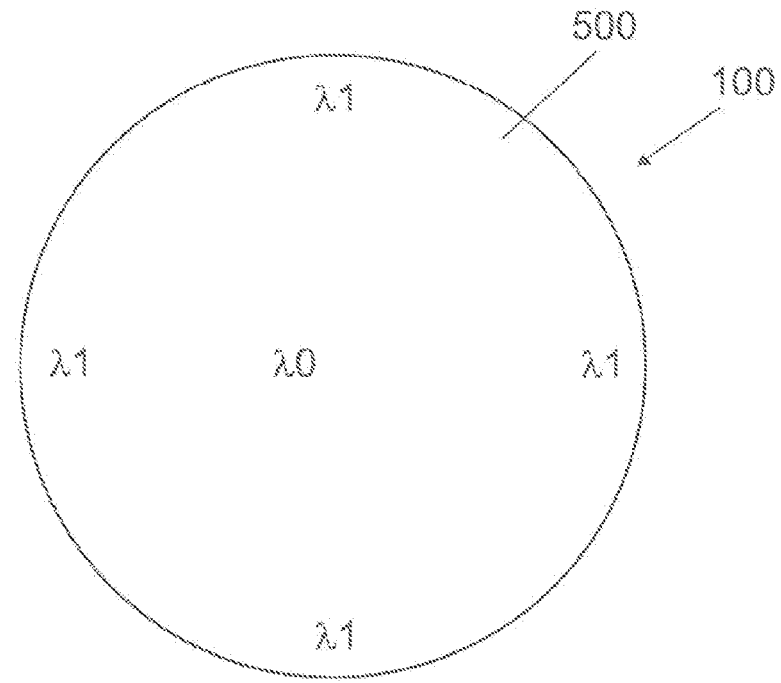

FIG. 1b shows a top view of a known optoelectronic semiconductor body 100. The semiconductor body has a disk shape. The semiconductor body is completely processed, i.e., all epitaxial layers have been grown on the substrate 102. The entirety of the epitaxial layers is provided with the reference sign 500. The inhomogeneous temperature profile during the growing of the epitaxial layers 500 can result in layers of unequal thickness and therefore in irregularities in the wavelength λ of the light-emitting optoelectronic components, which have been isolated from the semiconductor body. For example, a wavelength λ0 of an optoelectronic component which originates from the center of the optoelectronic semiconductor body 100 can be less than a wavelength λ1 of an optoelectronic component which originates from the edge of the optoelectronic semiconductor body 100.

Figure 1C:
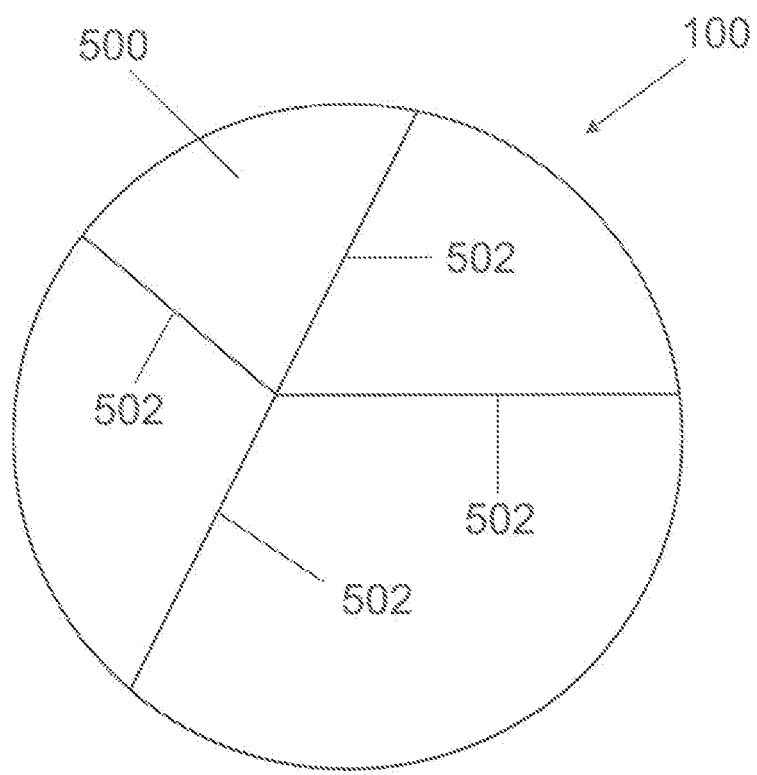
FIG. 1c shows a top view of cracks in the epitaxial layer of the known optoelectronic semiconductor body from FIG. 1b.

FIG. 1c shows a top view of a known optoelectronic semiconductor body 100. The semiconductor body is completely processed, i.e., all epitaxial layers have been grown. The entirety of the epitaxial layers is provided with the reference sign 500. Because of the high tension, cracks 502 can arise in the epitaxial layers 500. The cracks 502 preferably run parallel to the crystallographic axis of the epitaxial layers 500. The cracks 502 can make the optoelectronic semiconductor body 100 unusable.

Figure 2A:
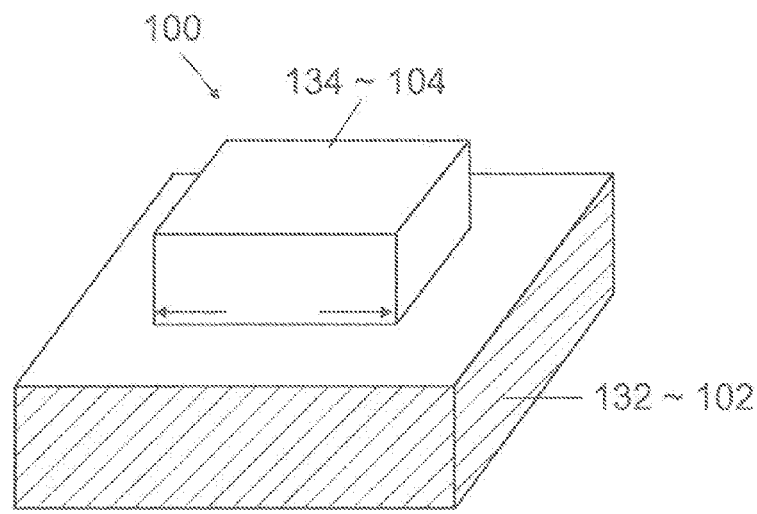
FIG. 2a shows a three-dimensional view of a detail of a known optoelectronic semiconductor body.

FIG. 2a shows a known semiconductor body 100. A GaN substrate 132 is shown as the substrate 102. The tensioned layer 104 is grown in the form of a shell layer 134 made of $In_xAl_yGa_{1-x-y}N$ (0≤x≤0.1 and 0≤y≤1). The shell layer 134 has a smaller atomic distance than the substrate 132. Therefore, the shell layer 134 is tensilely tensioned during the growth. This results in a yielding movement of the shell layer 134 with respect to the substrate 132. This yielding movement is indicated in FIG. 2a by two arrows. This compensating movement can result in cracks in the shell layer 134 or in epitaxial layers which follow the shell layer 134.

Figure 2B:
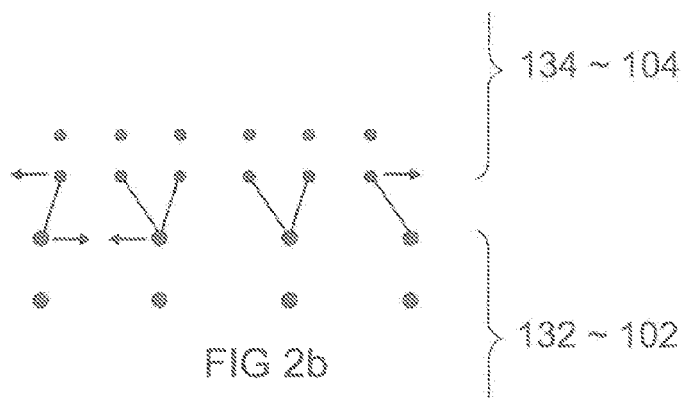
FIG. 2b schematically shows the mismatch of the lattice structure between substrate and tensioned layer.

FIG. 2b schematically shows the mismatch of the lattice structure between GaN substrate 132 and tensioned shell layer 134. The GaN substrate 132 has a greater atomic distance in the direction parallel to the interface of GaN substrate 132 and shell layer 134 than in the shell layer 134. Therefore, tensions occur in particular at the interface of GaN substrate 132 and shell layer 134. The shell layer 134 is tensilely tensioned.

Figure 2C:
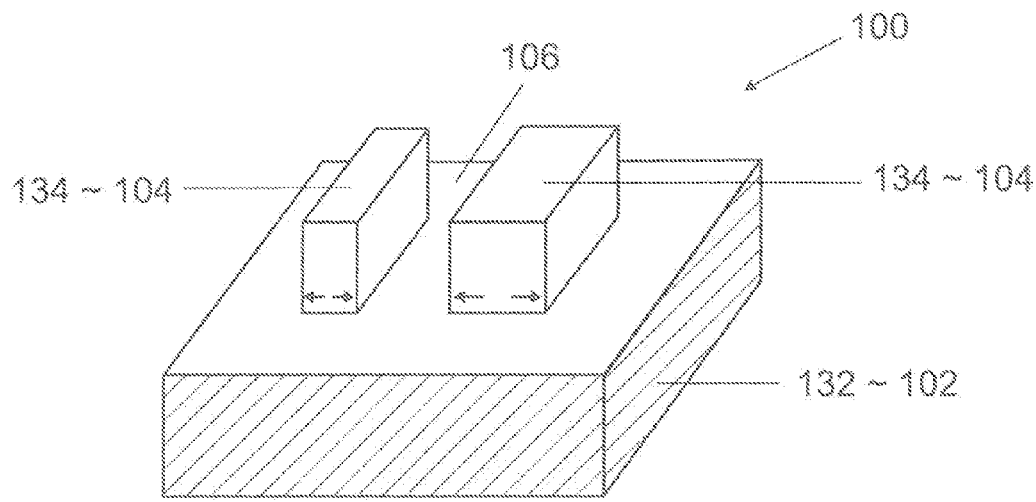
FIG. 2c shows a three-dimensional view of a detail of an optoelectronic semiconductor body after the structuring.

FIG. 2c shows a three-dimensional view of a detail of an optoelectronic semiconductor body 100 according to the proposed principle. The optoelectronic semiconductor body 100 is structured. During the structuring, recesses of a first type 106 are produced in the shell layer 134. The shell layer 134 can expand at the recesses 106, the tension and therefore the danger of cracking are reduced. In the optoelectronic semiconductor body 100 according to the proposed principle, the deflection of the semiconductor body 100 and the cracking in the epitaxial layers are reduced.

Figure 3:
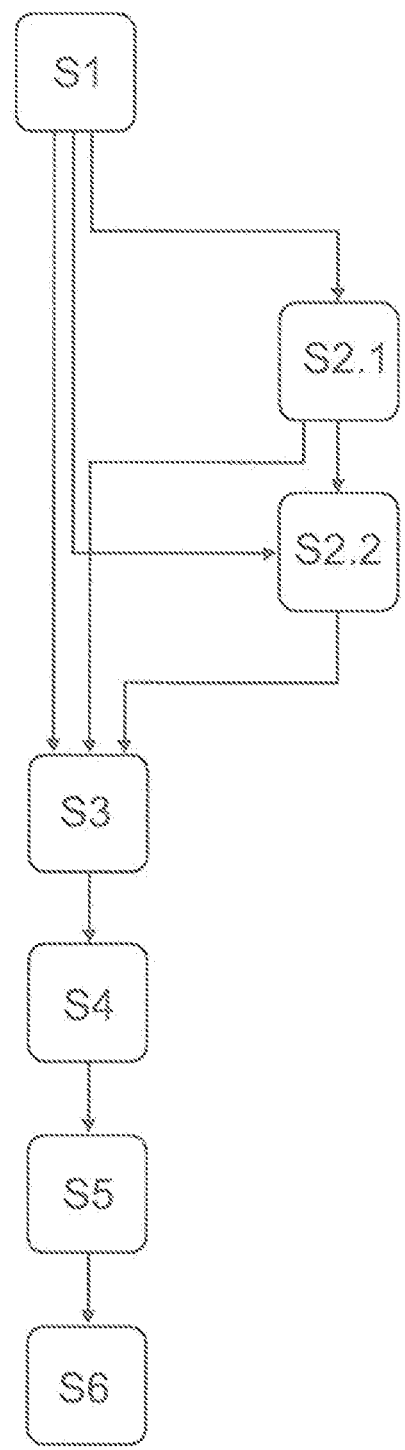
FIG. 3 shows a flow chart of the production of an optoelectronic semiconductor body.

FIG. 3 shows a flow chart of a production method for an optoelectronic semiconductor body 100. The production process may be divided into the steps S1 to S6. The steps S2.1 and S2.2 and the step S6 are optional.

Figure 3A:
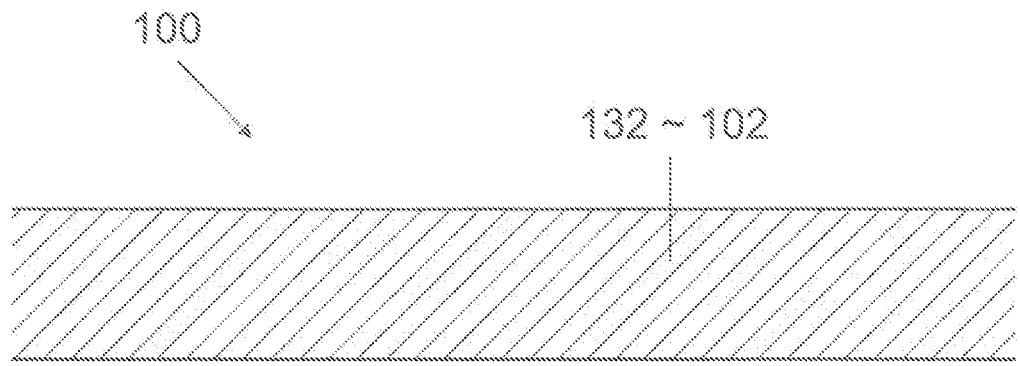
FIGS. 3a, 3a.1, 3a.2, 3a.3, 3b, 3c, and 3d show details in a sectional view of intermediate products of the production method of an optoelectronic semiconductor body.

In step S1, a substrate 102 is provided. FIG. 3a shows a sectional view of the result of step S1. The substrate 102 can be implemented as a GaN substrate 132.

In step S2.1, a buffer layer 112 made of InGaN is grown on the GaN substrate 132. In step S2.2, an intermediate layer 114, which is compressively tensioned and/or is electrically conductive, is grown. The intermediate layer 114 can have the composition $In_xGa_{1-x}N$ (0≤x≤0.5). The intermediate layer 114 can be grown directly on the GaN substrate 132 or directly on the buffer layer 112. The result of the optional step S2.1 is shown in FIG. 3a.1. The buffer layer 112 is grown directly on the GaN substrate 132. The result of optional step S2.2 is shown in FIGS. 3a.2 and 3a.3. In FIG. 3a.2, the intermediate layer 114 is grown on the buffer layer 112. In FIG. 3a.3, the buffer layer 112 is omitted and the intermediate layer 114 is grown directly on the GaN substrate 132.

Figure 3B:
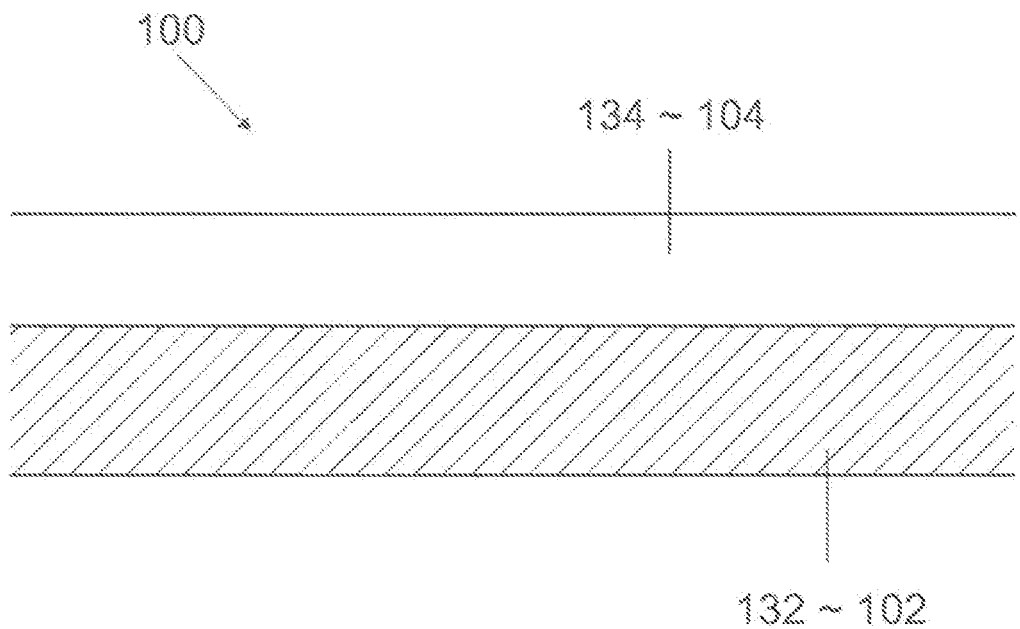

In step S3, a tensioned layer 104 is grown by epitaxy. The tensioned layer 104 can be grown on the substrate 102 directly following step 1. FIG. 3b shows a sectional view of the result of step S3. The tensioned layer 104 can be a shell layer 134 made of $In_xAl_yGa_{1-x-y}N$ (0≤x≤0.1 and 0<y≤1). The indium content x can vary between 0% and 10% atomic percentage. The aluminum content y can vary between 0.1% and 100% atomic percentage. The aluminum content y is preferably between 4% and 30% atomic percentage. The AlGaN shell layer 134 has a thickness between 1 μm and 3 μm. Alternatively, the tensioned shell layer 134 can be grown directly on the buffer layer 112 following step S2.1. Alternatively, the tensioned shell layer 134 can be grown directly on the intermediate layer 114 following step S2.2. The results of the growth of the tensioned shell layer 134 on the buffer layer 112 or on the intermediate layer 114 are not shown in the figures.

Figure 3C:
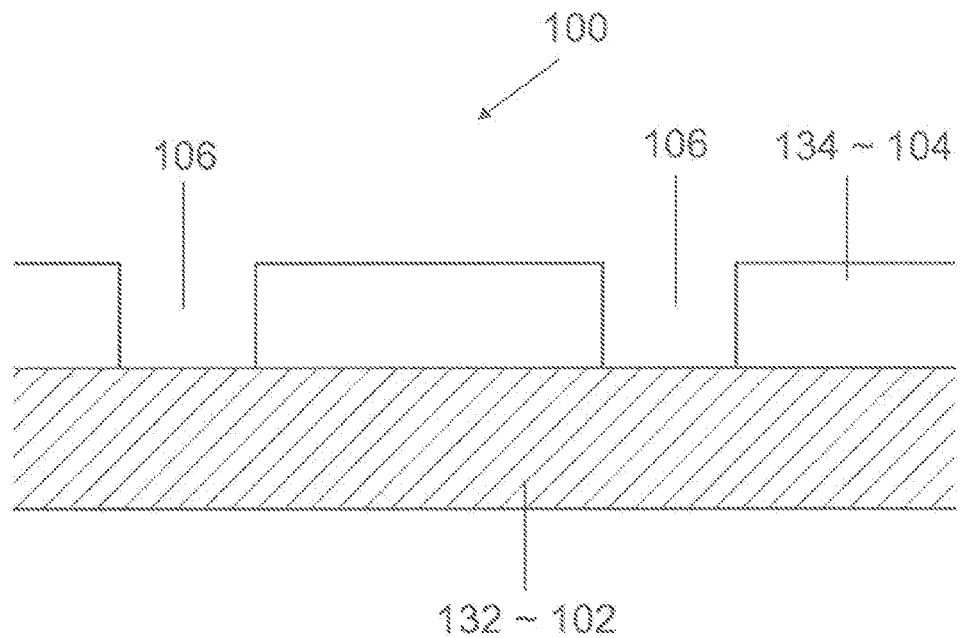

In step S4, the shell layer 134 is structured. Vertical recesses 106 are produced in the shell layer 134. The recesses 106 can be produced by an etching process. FIG. 3c shows a sectional view of the result of step S4.

Figure 3D:
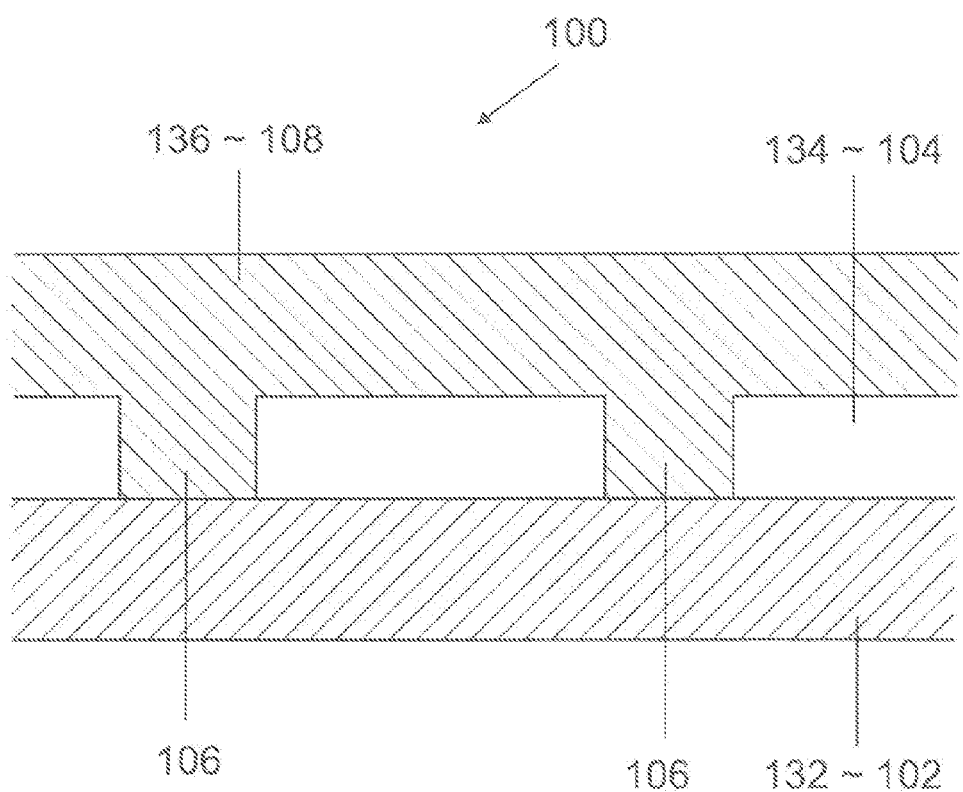

In step S5, a further layer 108 is grown. The further layer 108 fills up the recesses 106 and completely covers the shell layer 134. The further layer 108 can be an n-waveguide layer 136, which comprises GaN. FIG. 3d shows a sectional view of the result of step S5. The further layer 108 forms a level surface on which further layers can be grown epitaxially. This further growth of epitaxial layers is known and will not be described in greater detail in the present case.

In optional step S6, optoelectronic components 101 are isolated from the optoelectronic semiconductor body 100. The isolation can be performed by laser sawing. The results of step S6 are shown, for example, in FIGS. 11, 12, 13a, 13b, and 16.

Figure 4A:
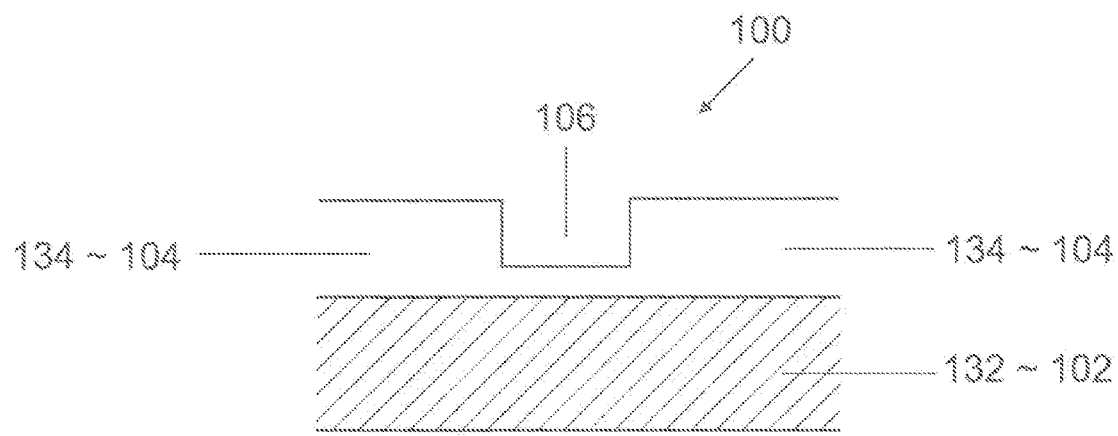
FIGS. 4a, 4b, 4c, and 4d show a sectional view of details of a semiconductor body.
Figure 4B:
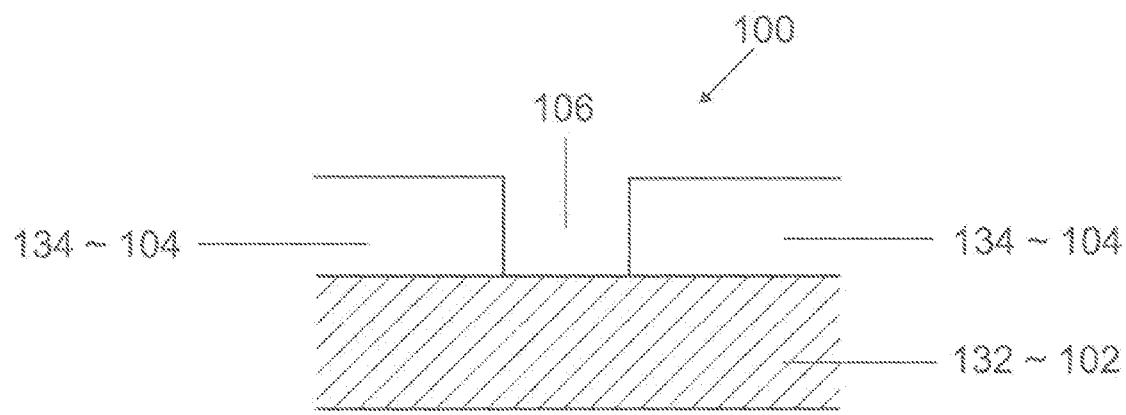
Figure 4C:
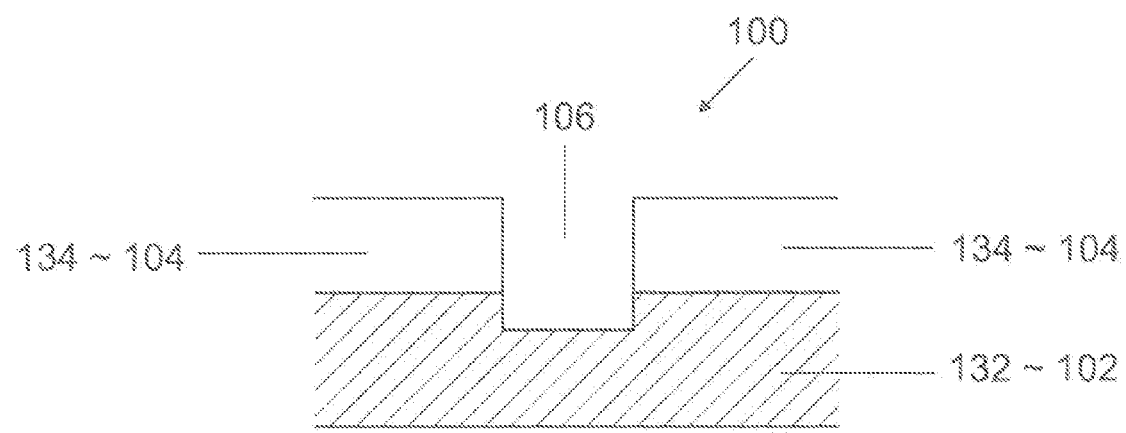
Figure 4D:
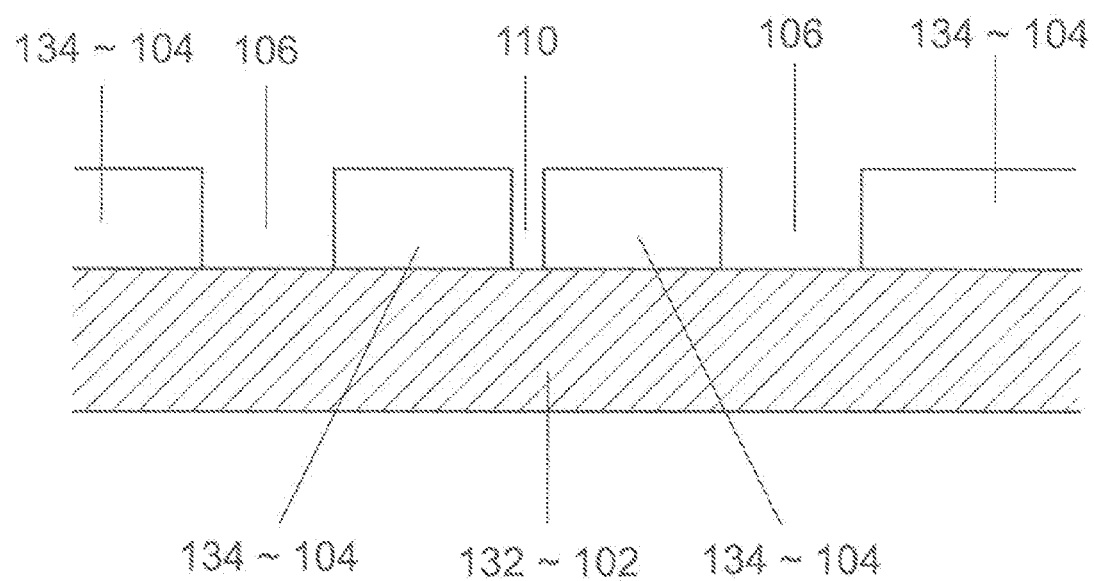

FIGS. 4a to 4d show details of structured optoelectronic semiconductor bodies 100. The tensioned shell layer 134 is grown directly on the GaN substrate 132. In FIG. 4a, the shell layer 134 is only thinned in the recess 106. In FIG. 4b, the recess 106 completely cuts through the tensioned shell layer 134. In FIG. 4c, the GaN substrate 132 is also thinned in the recess 106. The recesses of a first type 106 can have a width of 5 μm to 100 μm. The variants of the recess from FIGS. 4a, 4b, and 4c can occur during the production of the recess 106, since exact setting of the etching depth is difficult. In the exemplary embodiments 9, 10a, and 10b, for simplification, the recess 106 is only shown according to the variant in FIG. 4b. In FIG. 4d, both the recess of a first type 106 and also the recess of a second type 110 are shown. The recess of a second type 110 has a width of 0.1 μm to 5 μm. The recess of a second type 110 is used to reduce tension and also to inject current into layers which are arranged after the tensioned shell layer 134. These downstream layers are not shown in FIG. 4d.

Figure 5A:
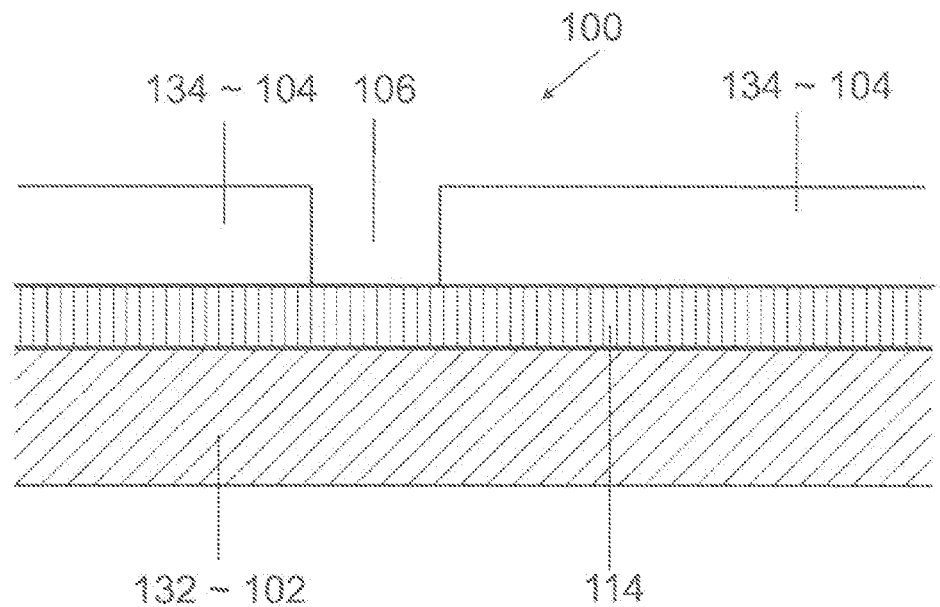
FIGS. 5a, 5b, and 5c show a sectional view of details of a semiconductor body having an intermediate layer.

FIG. 5a shows a detail of a semiconductor body 100 having an intermediate layer 114. The intermediate layer 114 comprises InGaN and is compressively tensioned. The InGaN intermediate layer 114 is grown on the GaN substrate 132. Since the AlGaN shell layer 134 is tensilely tensioned, by introducing an InGaN intermediate layer 114, the tension of the overall system can be reduced. The intermediate layer 114 must be electrically conductive in the exemplary embodiment of FIG. 5a, since the following layers are energized via the intermediate layer 114. The electrical conductivity is influenced by doping using silicon, oxygen, or germanium. In the case of silicon as the dopant, the silicon can be provided in a concentration of up to $5 \times 10^{18}$ atoms per $cm^3$. This is electrically conductive, but not highly electrically conductive. The recess 106 completely cuts through the tensioned shell layer 134.

Figure 5B:
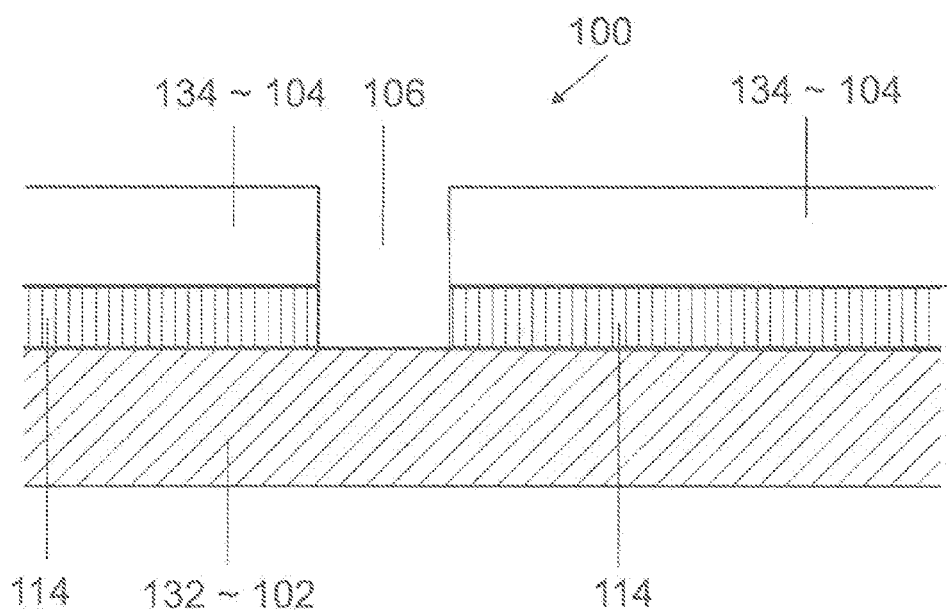

FIG. 5b shows a detail of a semiconductor body 100 in which the recess 106 completely cuts through the tensioned shell layer 134 and the intermediate layer 114. Otherwise, the exemplary embodiment in FIG. 5b corresponds to the exemplary embodiment in FIG. 5a.

Figure 5C:
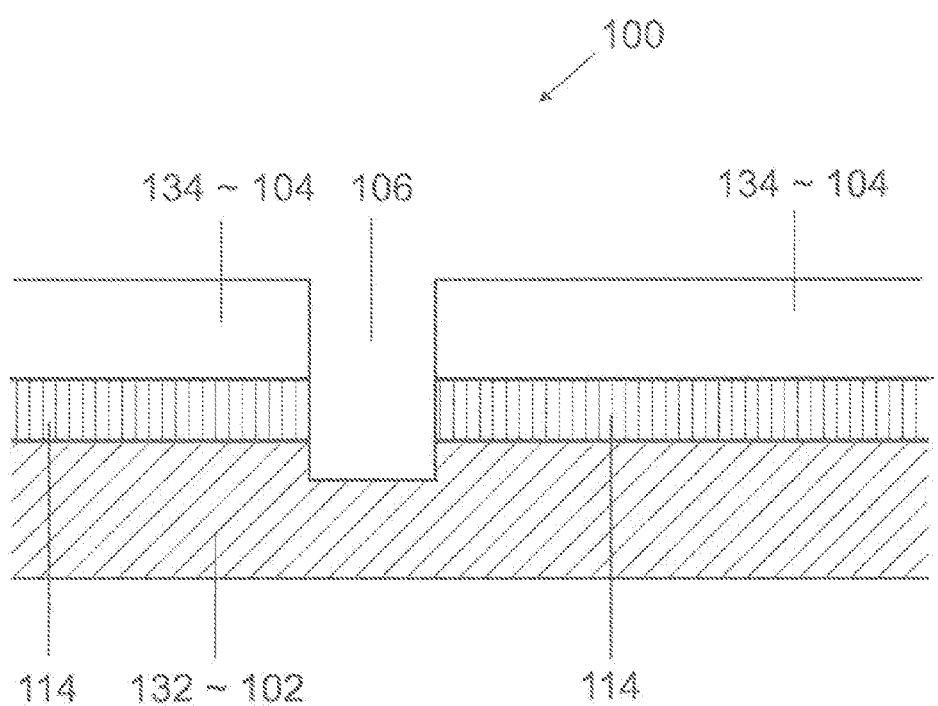

FIG. 5c shows a detail of a semiconductor body 100 in which the recess 106 completely cuts through the tensioned shell layer 134 and the intermediate layer 114. In addition, the GaN substrate 132 is thinned at the point of the recess 106. Otherwise, the exemplary embodiment in FIG. 5c corresponds to the exemplary embodiment in FIG. 5a.

Figure 6A:
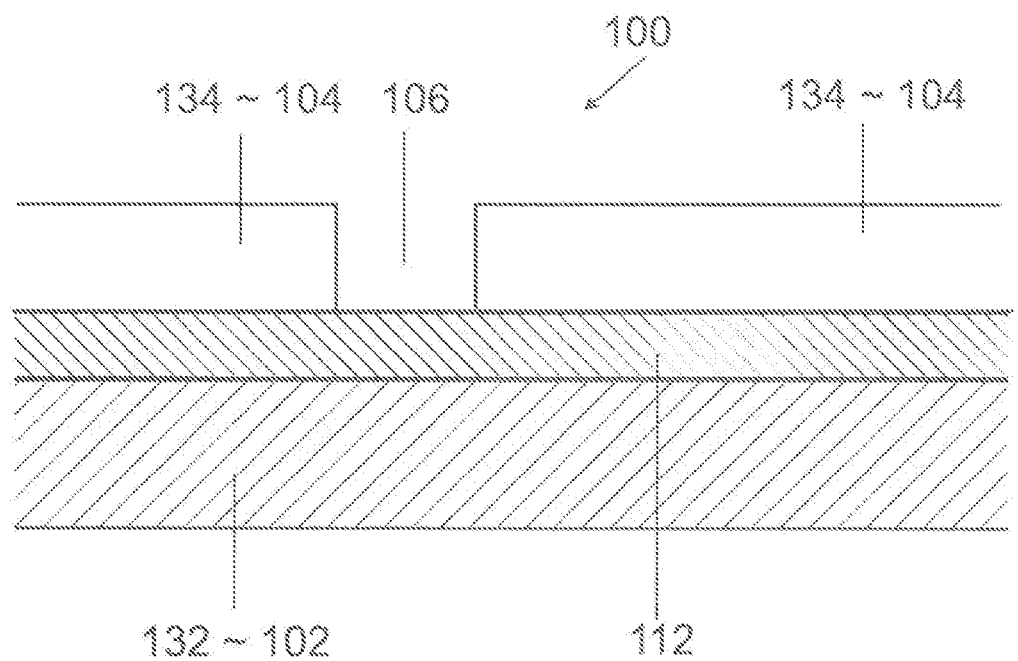
FIGS. 6a, 6b, and 6c show a sectional view of details of a semiconductor body having a buffer layer.

FIG. 6a shows a detail of a semiconductor body 100. In contrast to FIGS. 4a to 4d, FIG. 6a shows a buffer layer 112 between the GaN substrate 132 and the AlGaN shell layer 134. The buffer layer 112 made of InGaN is used as a growth layer for the AlGaN shell layer 134. The indium concentration in the buffer layer 112 can be 0. The buffer layer 112 is used for the purpose of providing a smooth surface having few inclusions. FIG. 6a has a recess 106, which completely cuts through the tensioned shell layer 134. The buffer layer 112 is not thinned.

Figure 6B:
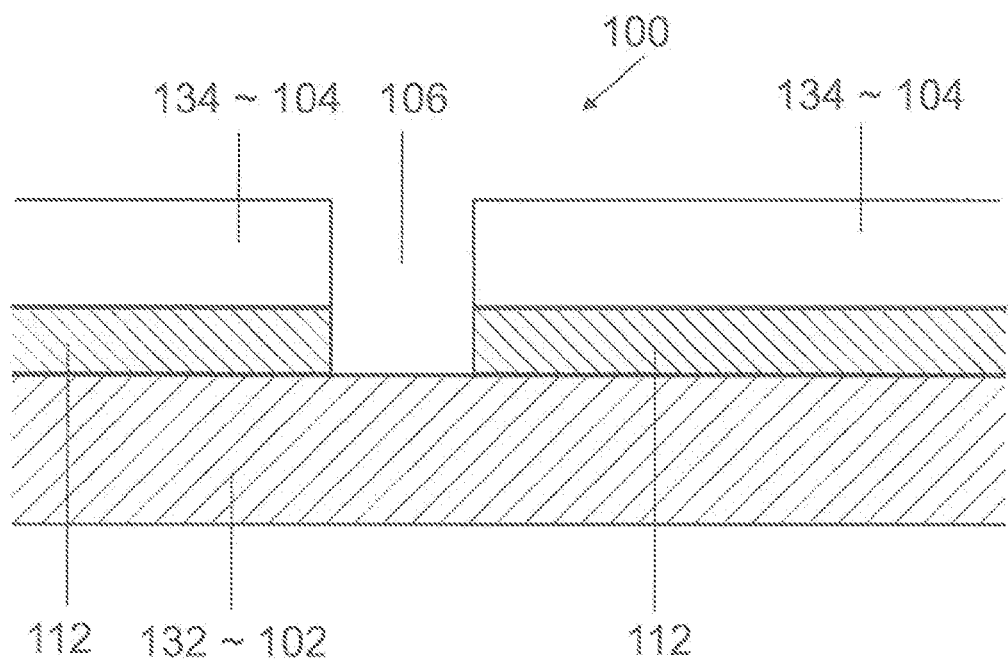

FIG. 6b shows a detail of a semiconductor body 100. In contrast to FIG. 6a, both the tensioned shell layer 134 and also the buffer layer 112 are completely cut through at the recess 106.

Figure 6C:
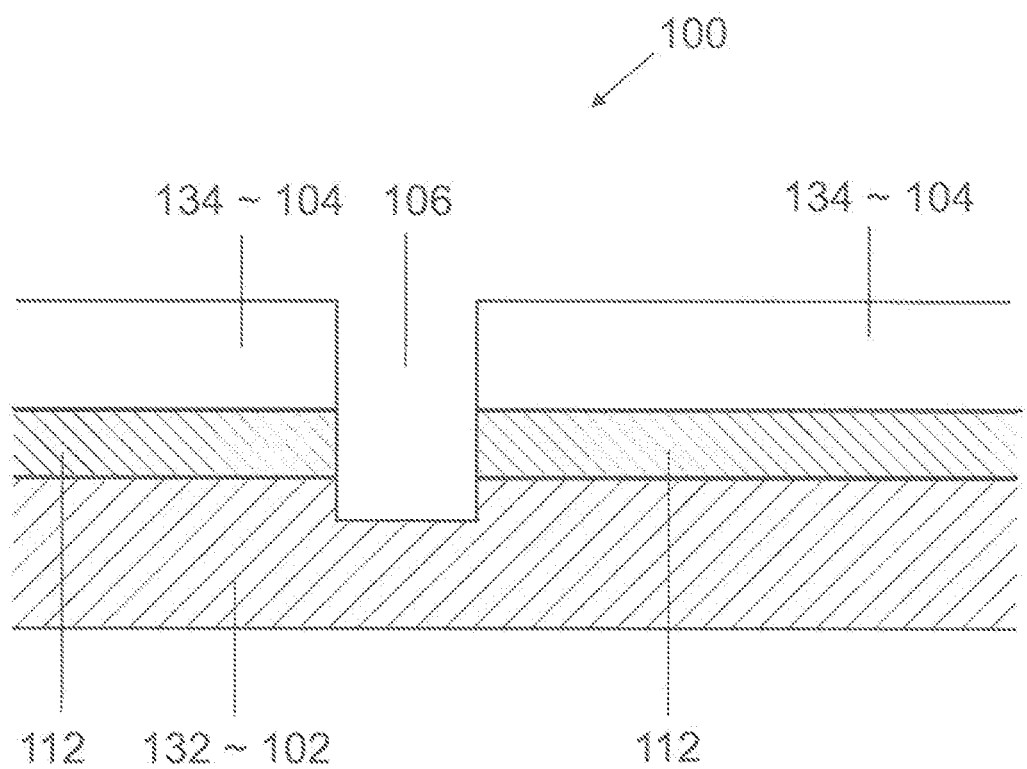

FIG. 6c shows a detail of a semiconductor body 100. In contrast to FIG. 6b, the tensioned shell layer 134 and the buffer layer 112 are completely cut through and in addition the GaN substrate 132 is thinned at the recess 106.

Figure 7A:
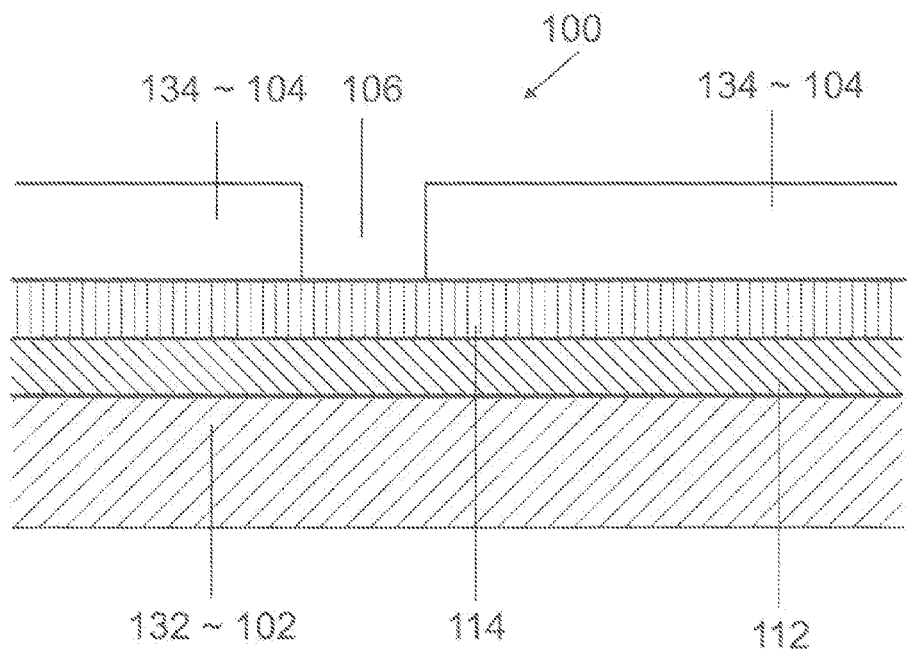
FIGS. 7a, 7b, and 7c show a sectional view of details of a semiconductor body having a buffer layer and an intermediate layer.

FIG. 7a shows a detail of a semiconductor body 100. In contrast to FIG. 5a, FIG. 7a additionally shows a buffer layer 112, preferably made of InGaN. The buffer layer 112 is arranged between the GaN substrate 132 and the InGaN intermediate layer 114. The recess 106 completely cuts through the tensioned shell layer 134. The intermediate layer 114, the buffer layer 112, and the GaN substrate 132 are not thinned at the recess 106. In order to supply following layers with current, the InGaN intermediate layer 114 must be electrically conductive. The electrical conductivity is achieved by doping the InGaN intermediate layer 114 with silicon in a concentration of less than $5 \times 10^{18}$ atoms per $cm^3$.

Figure 7B:
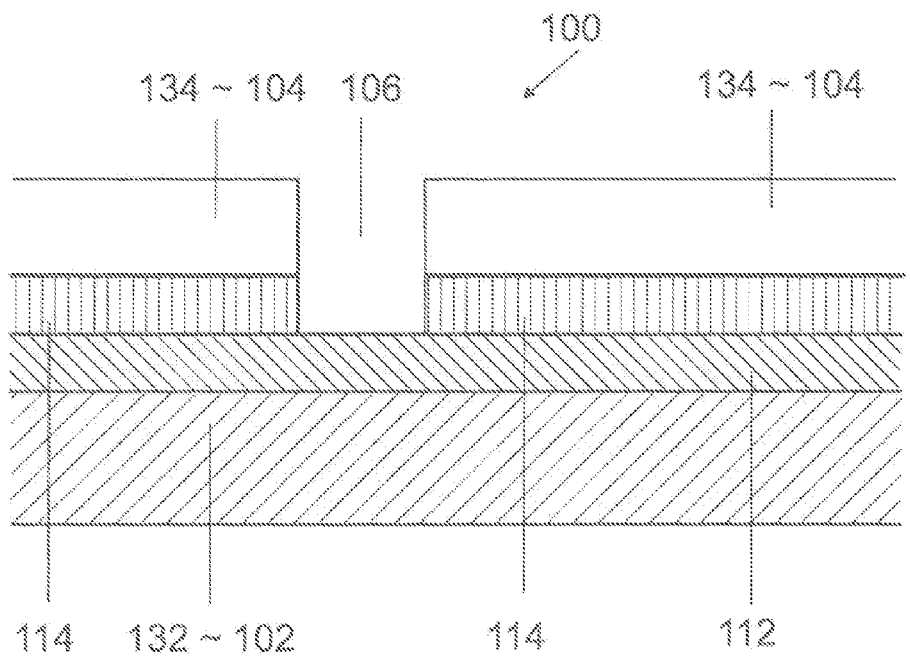

FIG. 7b shows a detail of a semiconductor body 100. In contrast to FIG. 7a, both the tensioned shell layer 134 and also the intermediate layer 114 are completely cut through at the recess 106 in FIG. 7b.

Figure 7C:
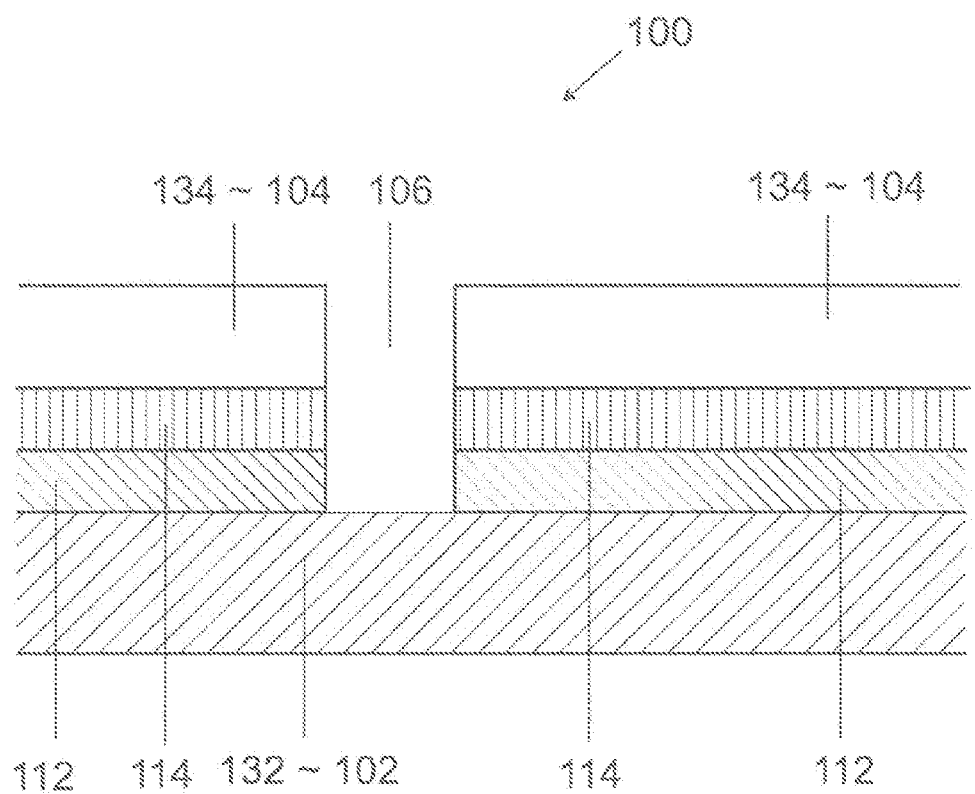

FIG. 7c shows a detail of a semiconductor body 100. In contrast to FIG. 7b, in FIG. 7c, the tensioned shell layer 134, the intermediate layer 114, and the buffer layer 112 are completely cut through at the recess 106.

Figure 8A:
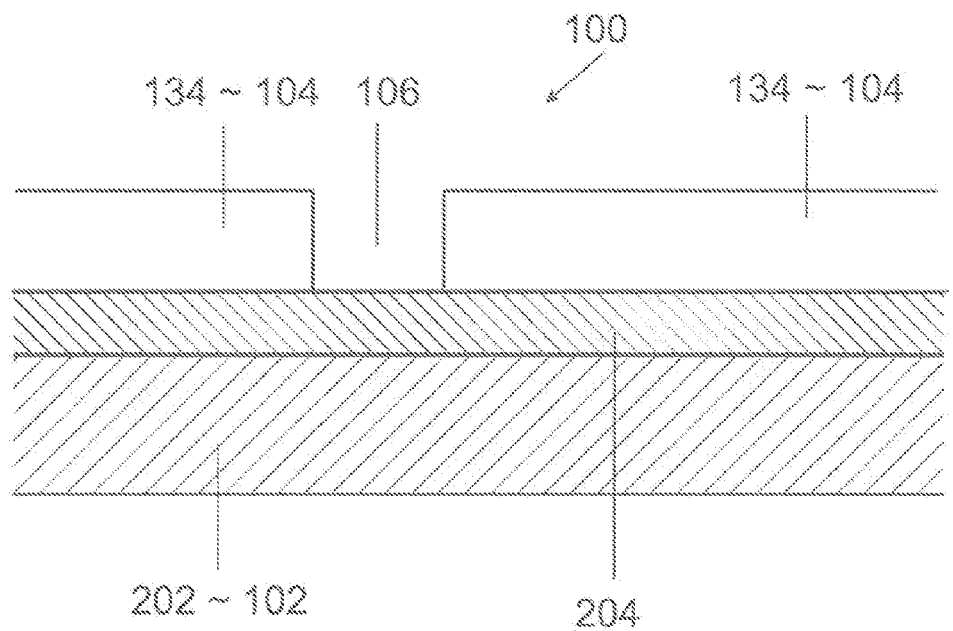
FIGS. 8a, 8b, and 8c show a sectional view of details of a semiconductor body having a quasi-substrate and a seed layer.

FIG. 8a shows a detail of a semiconductor body 100. FIG. 8a shows as a substrate 102 a so-called quasi-substrate 202, on which a so-called seed layer 204 is grown. The quasi-substrate 202 can comprise silicon or sapphire, the lattice constants of which deviate strongly from that of GaN. The seed layer 204 can comprise GaN and is used as a growth layer for the shell layer 134 made of AlGaN. The recess 106 completely cuts through the shell layer 134.

Figure 8B:
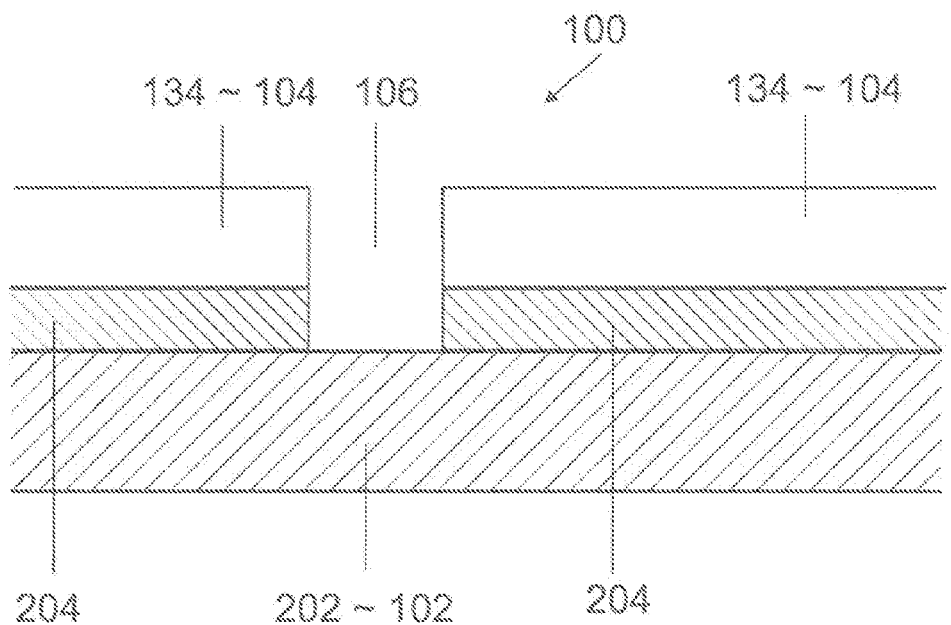

FIG. 8b shows a detail of a semiconductor body 100. In contrast to FIG. 8a, the recess 106 completely cuts through both the tensioned shell layer 134 and also the seed layer 204.

Figure 8C:
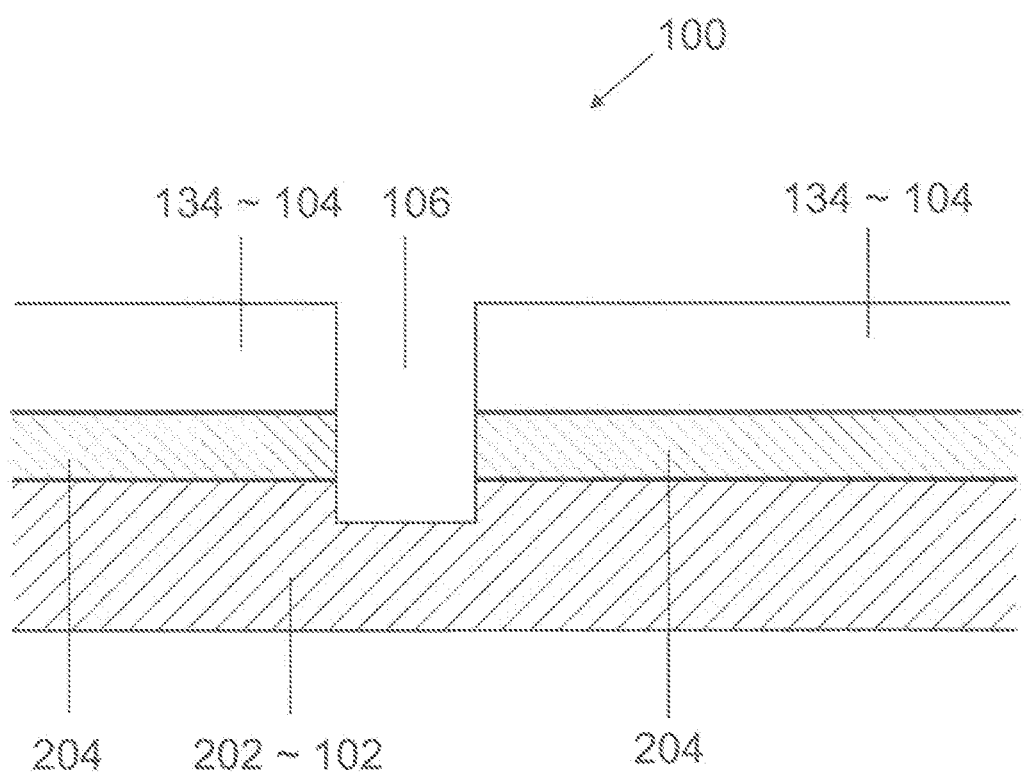

FIG. 8c shows a detail of a semiconductor body 100. In contrast to FIG. 8a, the recess 106 completely cuts through the tensioned shell layer 134 and the seed layer 204 and additionally thins the quasi-substrate 202 at the location of the recess 106.

Figure 9:
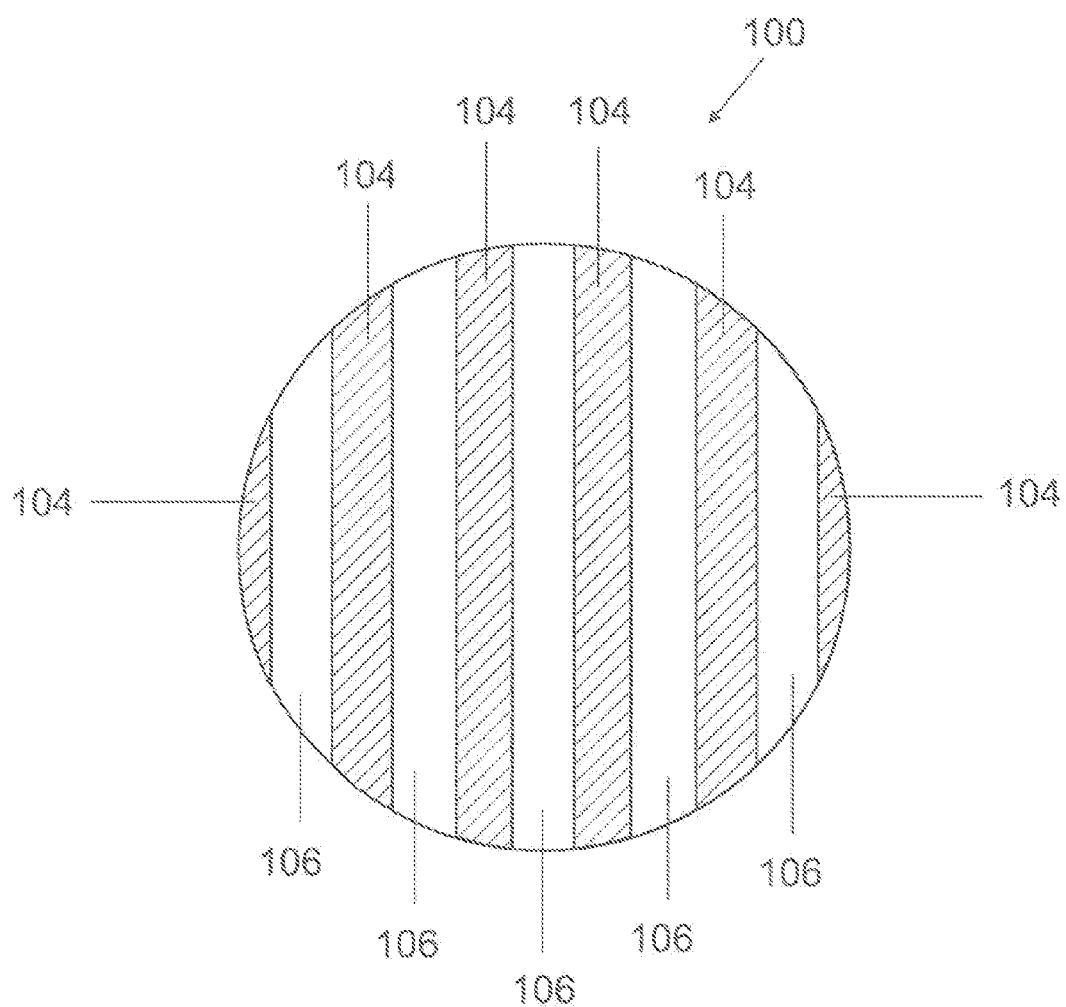
FIG. 9 shows a top view of a semiconductor body after the structuring of the tensioned layer.

FIG. 9 shows a top view of a semiconductor body 100 after the structuring of the tensioned layer 104. The recesses 106 and the interposed tensioned layer 104 each have a strip shape. Such a structured semiconductor body 100 as a base for further growth of epitaxial layers is suitable for producing optoelectronic components having an asymmetrical construction. Asymmetrical construction means that the extension of the component is significantly different in directions perpendicular to one another, i.e., length to width. Thus, for example, GaN laser edge emitters can be produced from the completely processed semiconductor body 100 by isolation.

Figure 10A:
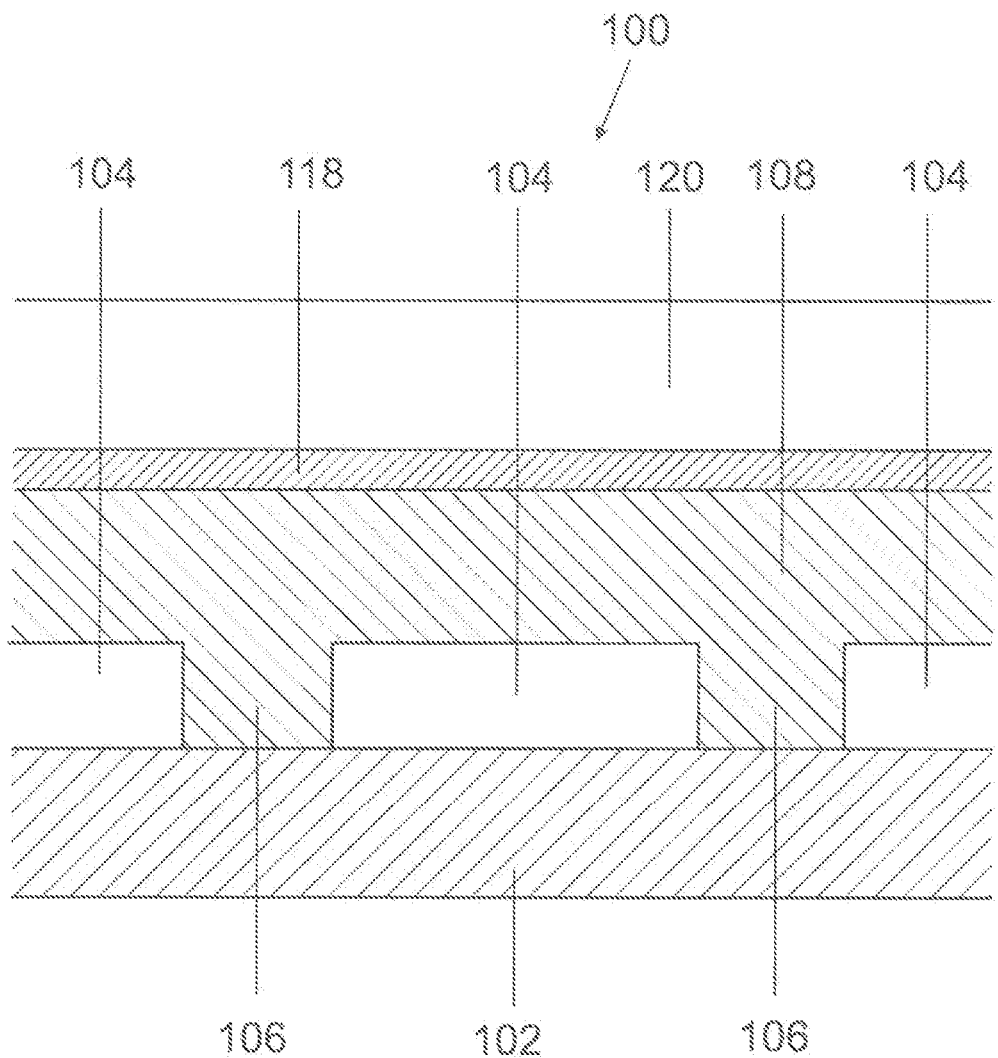
FIGS. 10a and 10b show a sectional view of details of a semiconductor body after the application of further layers.

FIG. 10a shows a detail of a semiconductor body 100. A tensioned layer 104 having recesses of a first type 106 is grown on the substrate 102. A further layer 108, preferably n-conductive, fills up the recesses 106 and covers the tensioned layer 104. An active zone 118 and a p-conductive layer 120 follow the n-conductive further layer 108 in the growth direction.

Figure 10B:
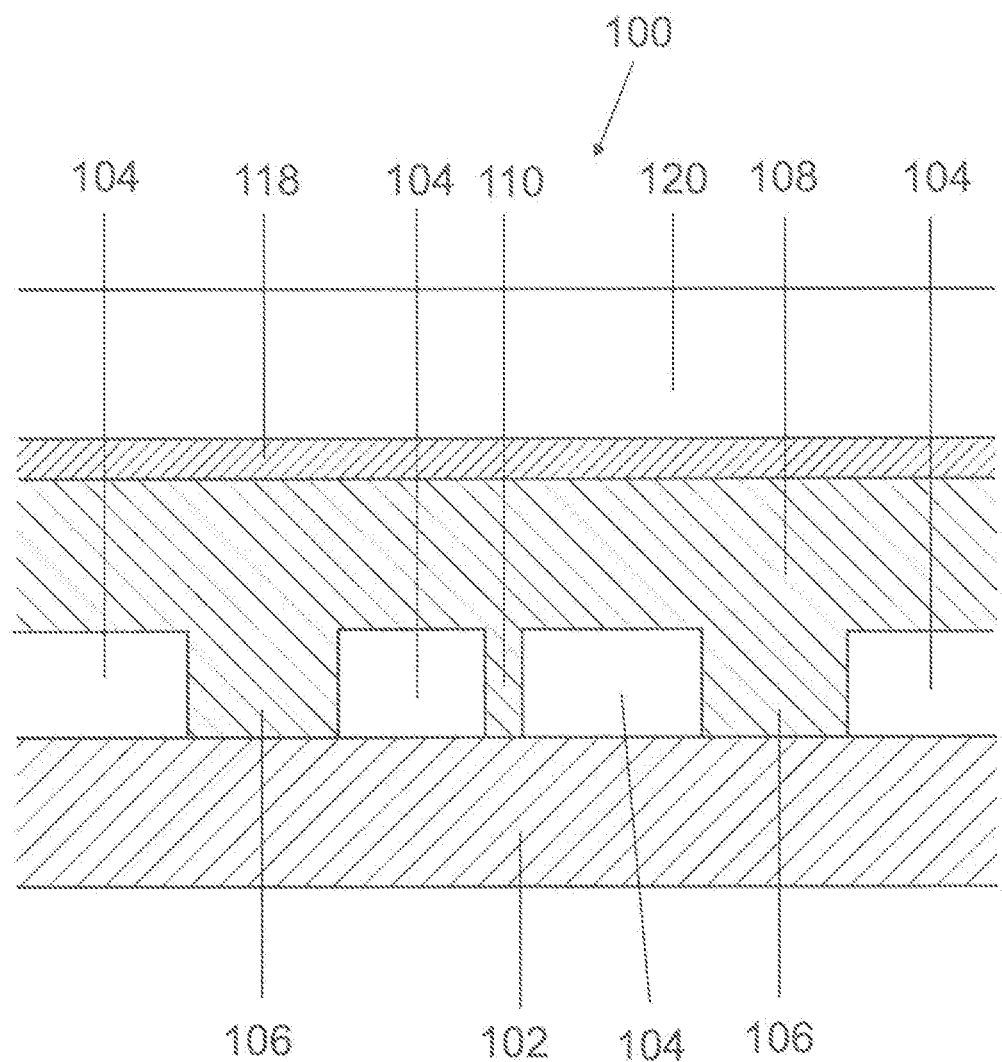

FIG. 10b shows a detail of a semiconductor body 100. In FIG. 10b, in contrast to FIG. 10a, a recess of a second type 110 is shown in addition to the recesses of a first type 106. The recess of a second type 110 is used, after the isolation of the semiconductor body 100 to form optoelectronic components 101, for better injection of current into layers which follow the tensioned layer 104.

Exemplary embodiments of optoelectronic components 101 are shown in following FIGS. 11, 12, 13a, and 13b. The optoelectronic components 101 are produced by isolation from an optoelectronic semiconductor body 100. The optoelectronic components 101 are edge-emitting laser diodes which are based on a GaN material system. The optoelectronic components 101 are isolated such that no recess of a first type 106 remains in the tensioned layer 104 of the optoelectronic component 101.

Figure 11:
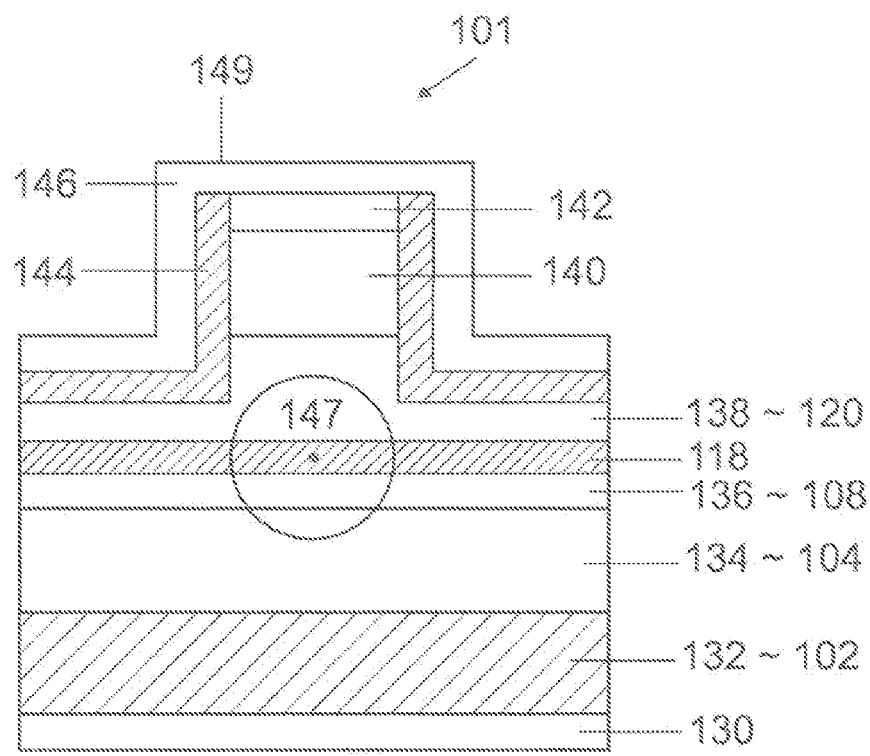
FIG. 11 shows an optoelectronic component, in particular an index-guided GaN laser edge emitter.

FIG. 11 shows an index-guided GaN laser edge emitter. The index guiding is achieved by lateral etching. The width of the entire edge emitter can be approximately 100 μm, the length of the edge emitter, and therefore the resonator length, can be approximately 600 μm. In the growth direction of the epitaxial layer sequence, the n-contact metallization 130 is followed by the GaN substrate 132, the n-shell layer 134 as the tensioned layer 104, the n-waveguide 136 as the further layer 108, the active zone 118, the p-waveguide 138, the p-shell layer 140, and the p-contact layer 142. A passivation and a p-contact metallization are applied to these epitaxial layers. The size of the laser facet 147 is determined by the width of the laser ridge 149 (English: RWG, ridge waveguide). The index jump occurs at the transition from the semiconductor material to air and at the transition from the waveguides 136, 138 to the shell layers 134, 140. An n-shell layer 134 having a thickness of greater than 1 μm and having a lowest possible index of refraction is advantageous. The low index of refraction can be produced by a high aluminum content. Optoelectronic components 101 having a thick n-shell layer 134 and a high aluminum content in the n-shell layer 134 can only be produced with sufficient quality if recesses 106 are provided in the n-shell layer 134 during the epitaxy process. The edge-emitting semiconductor laser can, depending on the material composition, emit electromagnetic radiation having a wavelength between approximately 200 nm and approximately 600 nm, i.e., between the ultraviolet spectral range and the yellow spectral range, preferably in the blue spectral range.

Figure 12:
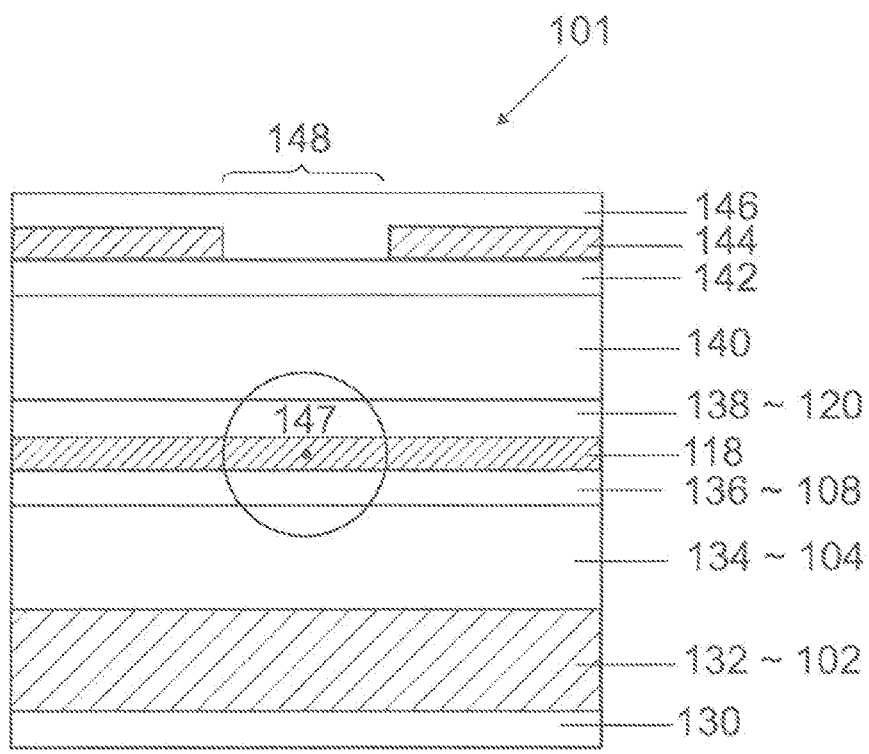
FIG. 12 shows an optoelectronic component, in particular a gain-guided GaN laser edge emitter.

FIG. 12 shows a solely gain-guided GaN laser edge emitter. The size of the laser facet 147 is determined by the width of the opening 148 of the passivation 144 over the p-contact layer 142.

Figure 13A:
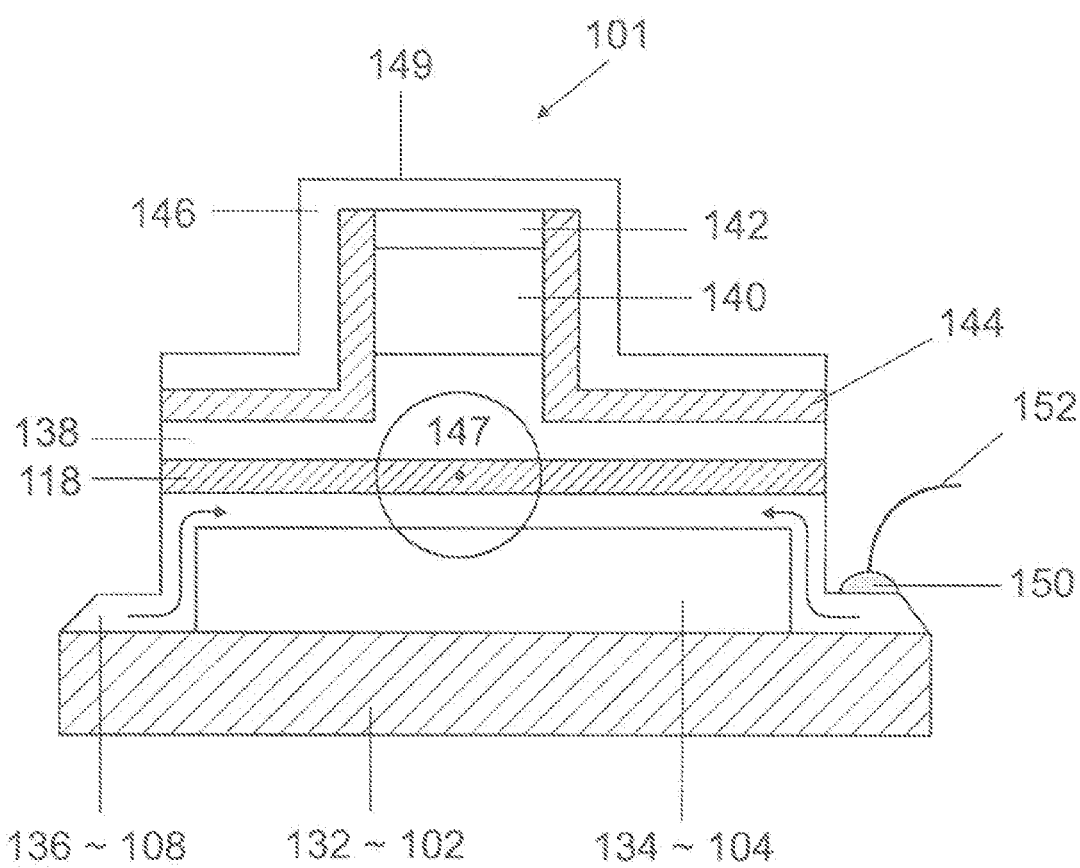
FIG. 13a shows an optoelectronic component, in particular an index-guided GaN laser edge emitter having an overgrown AlGaN shell layer.

FIG. 13a shows an index-guided GaN laser edge emitter having a completely overgrown n-shell layer 134. The GaN substrate 132 is followed by the n-shell layer 134 made of AlGaN. The composition of the n-shell layer 134 is $In_xAl_yGa_{1-x-y}N$ ($0 \le x \le 0.1$ and $0 \le y \le 1$). An n-waveguide 136 is grown on the n-shell layer 134. The composition of the n-waveguide 136 is $In_xAl_yGa_{1-x-y}N$ ($0 \le x \le 0.1$ and $0 \le y \le 0.3$). The n-waveguide 136 additionally laterally covers the AlGaN shell layer 134. A contact pad 150, which is energized via a bond wire 152, is arranged laterally on the n-waveguide 136. The contact pad 150 represents the n-contact. The lateral overgrowth of the AlGaN shell layer 134 by the InAlGaN waveguide 136 results in a substantial improvement of the electrical injection into layers which are arranged after the AlGaN shell layer 134. This is advantageous in particular in the case of an AlGaN shell layer 134 having a thickness of greater than 1 μm and an aluminum content of greater than 30% atomic percentage. An AlGaN shell layer 134 implemented in this manner has a low electrical conductivity. The n-waveguide layer 136 is followed by an active zone 118, a p-waveguide 138, a p-shell layer 140, and a p-contact layer 142. In addition, a passivation 144 is provided. The p-contact metallization 146 provides the p-contact. The laser ridge 149 is produced by lateral etching of the epitaxial layers p-waveguide 138, p-shell layer 140, and p-contact layer 142. In other words, if the n-conductive layers, such as the n-waveguide layer 136, are energized by bypassing the AlGaN shell layer 134, substrates having low electrical conductivity such as sapphire and silicon and AlGaN shell layers 134 having an aluminum content of greater than 30% atomic percentage can be used.

Figure 13B:
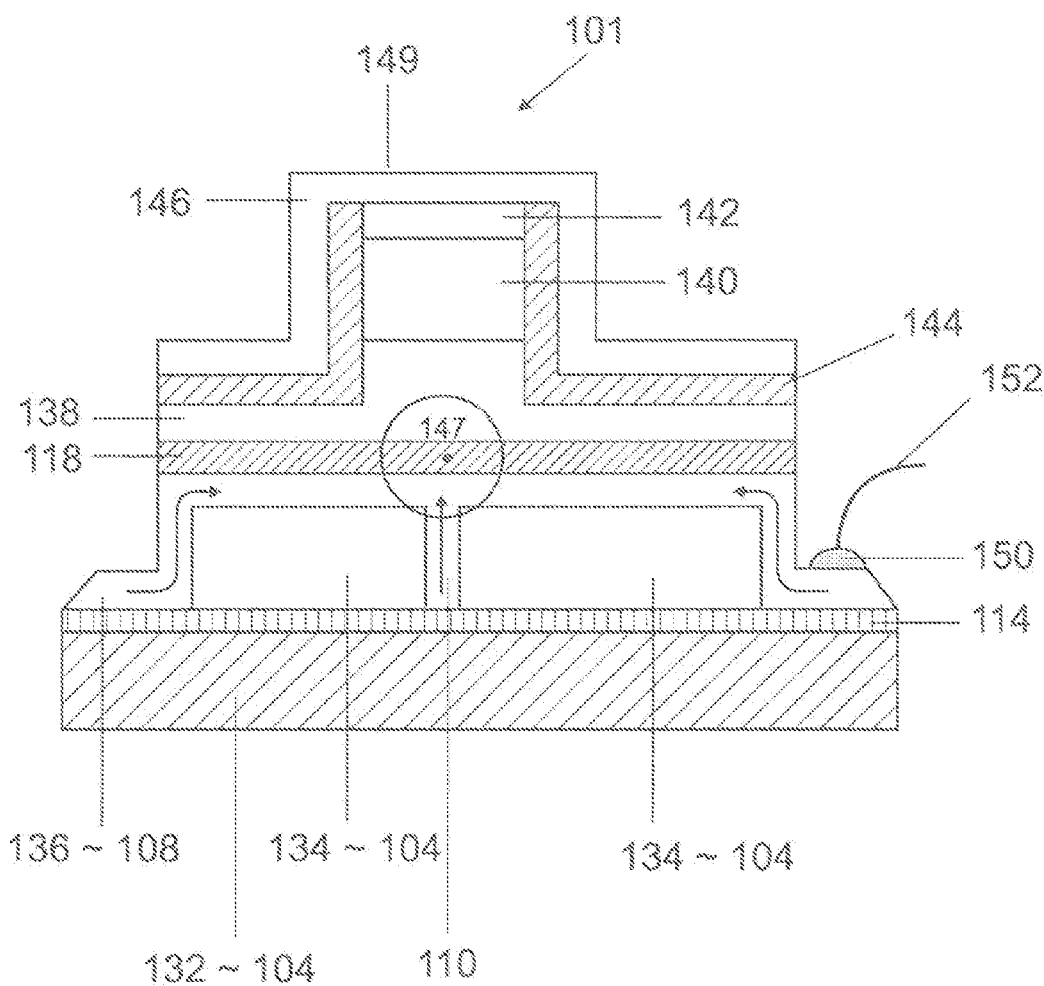
FIG. 13b shows an optoelectronic component, in particular an index-guided GaN laser edge emitter having an overgrown AlGaN shell layer.

FIG. 13b shows an index-guided GaN laser edge emitter having a completely overgrown n-shell layer 134. An intermediate layer 114 is applied to the GaN substrate 132. The influence of the intermediate layer 114 on the optical properties of the GaN laser edge emitter is negligible. The intermediate layer is electrically conductive. The electrically conductive intermediate layer 114 is predominantly used for current spreading. The electrically conductive intermediate layer 114 comprises highly n-doped $In_xGa_{1-x}N$ with $0 \le x \le 0.2$. Silicon, oxygen, or germanium is used as the dopant. In the case of silicon as the dopant, the concentration of the silicon is greater than $5 \times 10^{18}$ atoms per $cm^3$. The electrically conductive layer 114 can be compressively tensioned. The AlGaN shell layer 134 has a recess of a second type 110. The arrangement of the electrically conductive intermediate layer 114 in conjunction with the recess of a second type 110 is necessary if the AlGaN shell layer 134 has a low electrical conductivity because of its high aluminum content. A current injection directly under the laser ridge 149 is possible through the recess of a second type 110. The recess of a second type 110 is so narrow, at a maximum of 5 μm width, that the light wave oscillating in the laser resonator under the laser ridge 149 is not disturbed. Otherwise, the optoelectronic component 101 shown in FIG. 13b corresponds to the optoelectronic component 101 shown in FIG. 13a.

Figure 14A:
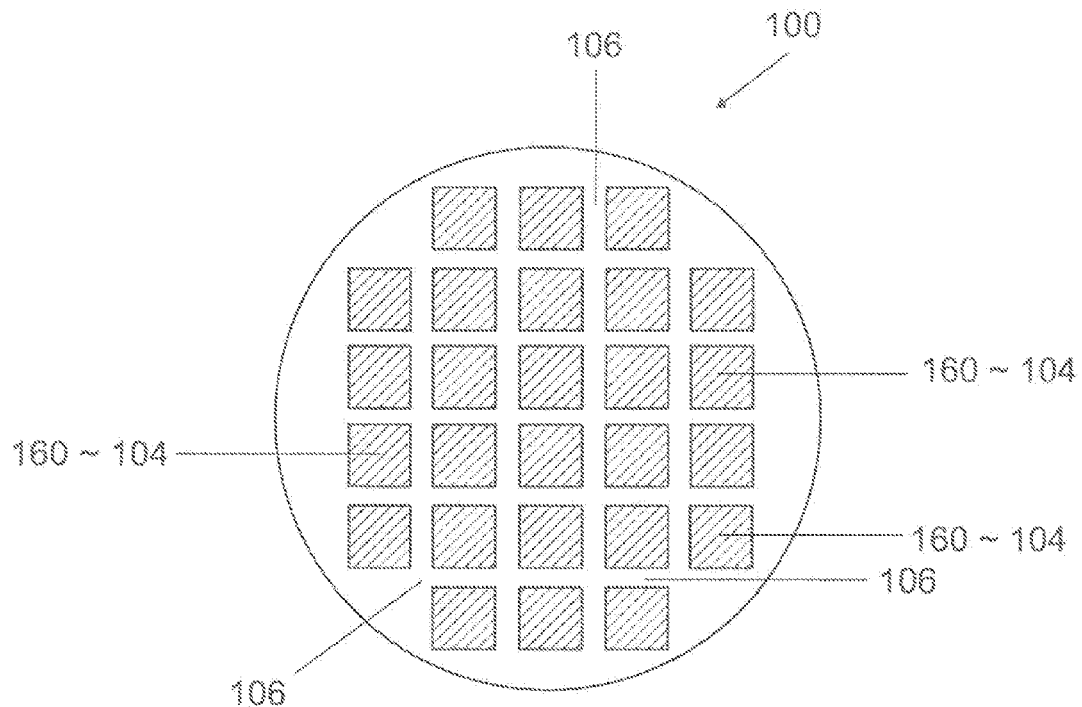
FIG. 14a shows a top view of a semiconductor body after the structuring of the tensioned layer.

FIG. 14a shows a top view of a semiconductor body after the structuring of the tensioned layer 104. The tensioned layer 104 is implemented in the present case as an n-type GaN Bragg mirror 160. The n-type Bragg mirror 160 is entirely interrupted by the recesses 106.

Figure 14B:
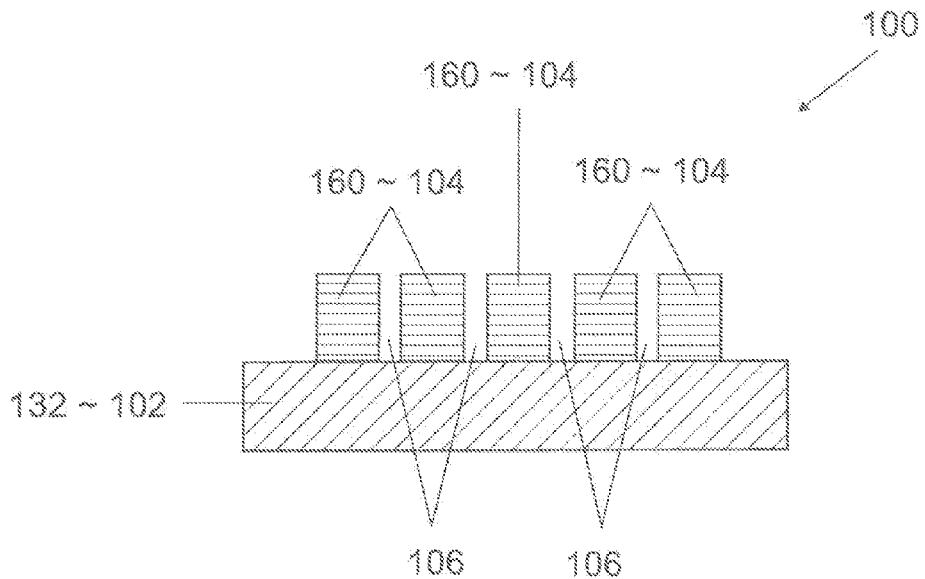

FIG. 14b shows a sectional view of the semiconductor body 100 from FIG. 14a. The n-type Bragg mirrors 160 are grown on the GaN substrate 132. The n-type Bragg mirrors 160 have alternating layers made of $In_xGa_{1-x}N$ ($0 \le x \le 0.2$) and $Al_yGa_{1-y}N$ ($0 \le y \le 1$).

Figure 15:
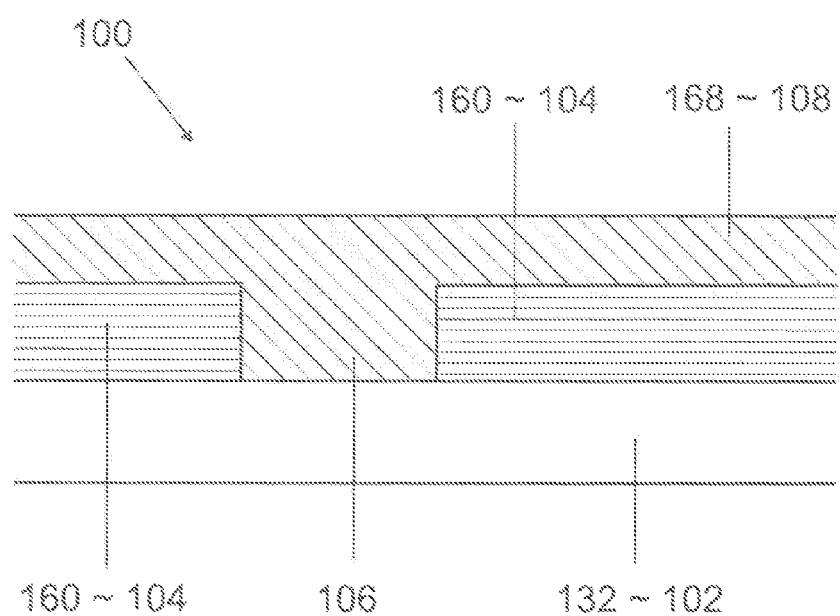
FIG. 15 shows a sectional view of a detail of the semiconductor body from FIG. 14b having a further layer.

FIG. 15 shows a sectional view of a detail of the semiconductor body from FIG. 14b having the n-terminal layer 168 as the further layer 108. The n-terminal layer 168 fills up the recess 106 and provides a level surface for the following growth of further epitaxial layers. The electrically conductive n-terminal layer 168 is n-conductive. The n-terminal layer 168 comprises $Al_yIn_xGa_{1-x-y}N$, with $0 \le x \le 0.15$ and $0 \le y \le 0.2$. For the electrical conductivity, the n-terminal layer 168 is doped with silicon, oxygen, or germanium. In the case of silicon as a dopant, the concentration is less than $5 \times 10^{18}$ atoms per $cm^3$. The concentration of the dopant is to be as low as possible in order to keep the absorption of electromagnetic radiation and the density of defects as low as possible. On the other hand, the concentration of the dopant must be high enough to ensure a sufficient electrical conductivity in the n-terminal layer 168.

Figure 16:
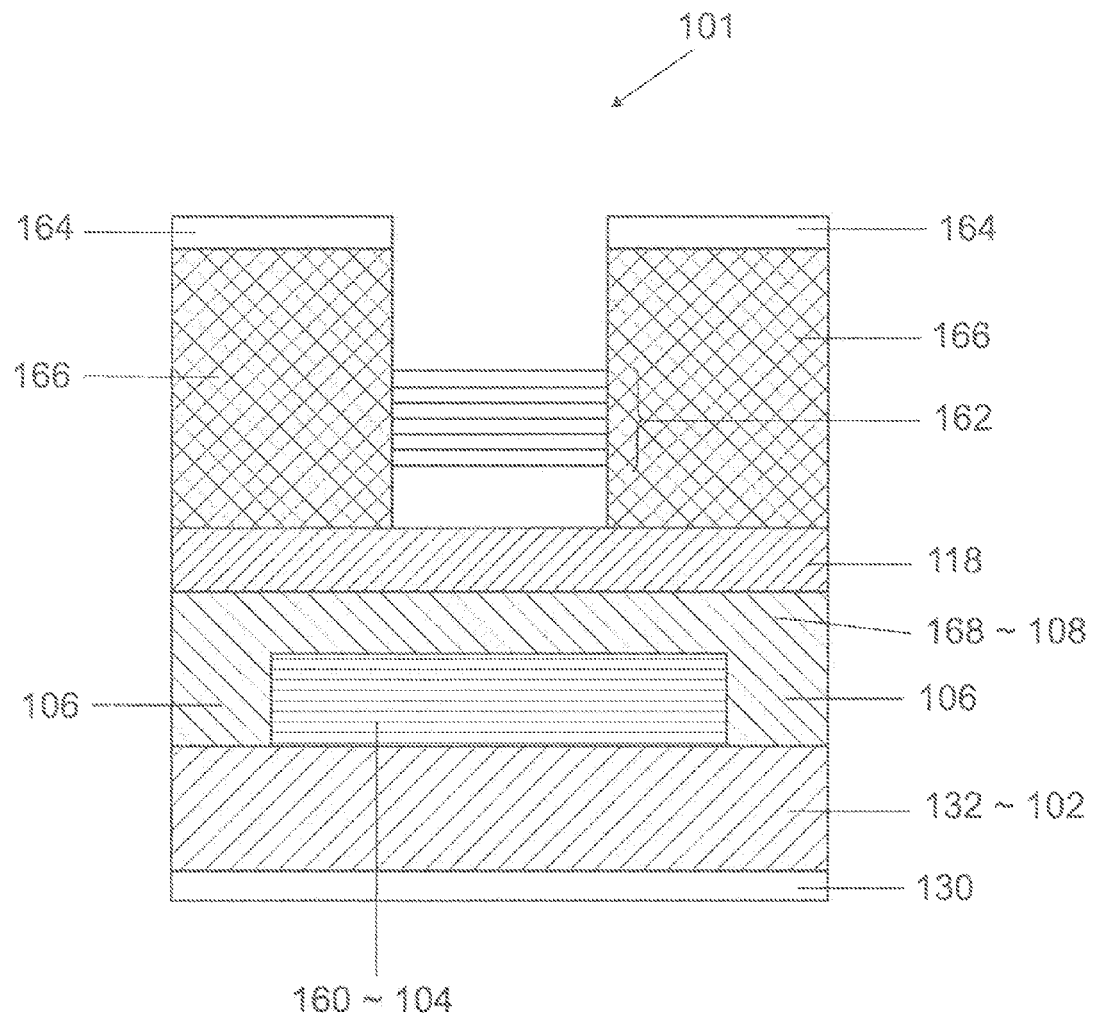
FIG. 16 shows an optoelectronic component in a sectional view, in particular a VCSEL GaN laser.

FIG. 16 shows a VCSEL GaN laser as an optoelectronic component 101. This vertically emitting laser can be isolated from a semiconductor body 100 according to FIGS. 14a and 14b having additionally grown epitaxial layers. The semiconductor body 100 was further processed in this case such that lateral recesses 106 are provided in the n-side Bragg mirror 160 of the VCSEL GaN laser. In the VCSEL GaN laser, the n-contact metallization 130 is followed with the GaN substrate 132, the n-side Bragg mirror 160, the n-terminal layer 168, the active zone 118, the p-side Bragg mirror 162, and the p-contact 164. The n-side Bragg mirror 160 has alternating layers made of $In_xGa_{1-x}N$ ($0 \le x \le 0.2$) and $Al_yGa_{1-y}N$ ($0 \le y \le 1$). The p-side Bragg mirror 162 can be epitaxially grown and can have alternating layers made of $In_xGa_{1-x}N$ ($0 \le x \le 0.2$) and $Al_yGa_{1-y}N$ ($0 \le y \le 1$). Alternatively, the p-side Bragg mirror 162 can have dielectric oxide layers. Titanium dioxide, aluminum oxide, silicon oxide, or tantalum oxide can be used as the materials. The p-terminal layer 166 comprises $Al_yIn_xGa_{1-x-y}N$, with $0 \le x \le 0.15$ and with $0 \le y \le 0.2$. In the above value range for x and y, the p-terminal layer 166 is electrically conductive and stable. The p-terminal layer 166 has a doping using magnesium atoms. The concentration of the magnesium atoms is less than $10^{20}$ atoms per $cm^3$. The n-terminal layer 168 and the p-terminal layer 166 arranged between the n-side Bragg mirror 160 and the active zone 118 are used for energizing the active zone.

The VCSEL GaN laser can, depending on the material composition, emit electromagnetic radiation at a wavelength between approximately 200 nm and approximately 600 nm, i.e., between the ultraviolet spectral range and the yellow spectral range, preferably in the blue spectral range.

The invention claimed is:

1. An optoelectronic semiconductor body comprising:
    a substrate;
    a tensioned layer applied in a first epitaxy step to the substrate, wherein the tensioned layer has a recess formed vertically in the tensioned layer, the recess comprising a recess of a first type and a recess of a second type, the recess of the first type having a width of 5 μm to 100 μm, and the recess of the second type having a width of 0.1 μm to 5 μm, wherein the width of the recess of the first type is larger than the width of the recess of the second type; and
    a further layer is applied to the tensioned layer in a second epitaxy step, the further layer filling up the recess and at least regionally covering the tensioned layer.

2. The optoelectronic semiconductor body according to claim 1, wherein the deviation of the lattice constant of the further layer from the lattice constant of the substrate is less than the deviation of the lattice constant of the tensioned layer from the lattice constant of the substrate.

3. The optoelectronic semiconductor body according to claim 1, wherein the lattice constant of the tensioned layer is less than the lattice constant of the substrate and at the same time the lattice constant of the further layer is greater than the lattice constant of the substrate.

4. The optoelectronic semiconductor body according to claim 1, wherein the tensioned layer is thinned in the recess.

5. The optoelectronic semiconductor body according to claim 1, wherein the tensioned layer is entirely interrupted in the recess.

6. The optoelectronic semiconductor body according to claim 1, wherein the further layer completely covers the tensioned layer.

7. The optoelectronic semiconductor body according to claim 1, wherein the tensioned layer has a thickness between 0.5 μm and 5 μm.

8. An optoelectronic semiconductor body comprising:
a substrate;
a tensioned layer, which is applied in a first epitaxy step to the substrate, wherein the tensioned layer has a recess formed vertically in the tensioned layer; and
a further layer is applied to the tensioned layer in a second epitaxy step, the further layer filling up the recess and at least regionally covers the tensioned layer, wherein the lattice constant of the tensioned layer is less than the lattice constant of the substrate and at the same time the lattice constant of the further layer is greater than the lattice constant of the substrate.

9. The optoelectronic semiconductor body according to claim 8, wherein the recess comprises a recess of a first type and a recess of a second type.

10. The optoelectronic semiconductor body according to claim 9, wherein the recess of the second type has a width of 0.1 μm to 5 μm.

11. The optoelectronic semiconductor body according to claim 1, wherein the substrate comprises GaN and the tensioned layer is a shell layer made of $In_xAl_yGa_{1-x-y}N$ ($0 \leq x \leq 0.1$ and $0 \leq y \leq 1$).

12. The optoelectronic semiconductor body according to claim 11, wherein an intermediate layer made of $In_xGa_{1-x}N$ ($0 \leq x \leq 0.5$) is applied between the shell layer and the substrate.

13. The optoelectronic semiconductor body according to claim 12, wherein the intermediate layer is electrically conductive and/or compressively tensioned.

14. The optoelectronic semiconductor body according to claim 1, wherein the substrate comprises GaN and the tensioned layer is a Bragg mirror made of alternating layers of $In_xGa_{1-x}N$ ($0 \leq x \leq 0.2$) and $Al_yGa_{1-y}N$ ($0 \leq y \leq 1$).

15. The optoelectronic semiconductor body according to claim 1, wherein the further layer grown in the second epitaxy step has an n-conductivity.

16. The optoelectronic semiconductor body according to claim 15, wherein, on the further layer grown in the second epitaxy step, the following layers follow one another in the growth direction:
an active zone; and
a layer having a second p-conductivity.

17. An optoelectronic component, which was isolated from an optoelectronic semiconductor body according to claim 16.

18. The optoelectronic component according to claim 17, wherein the tensioned layer is laterally overgrown by an n-conductive layer.

19. The optoelectronic semiconductor body according to claim 9, wherein the recess of the first type has a width of 5 μm to 100 μm.

* * * * *